(12) United States Patent
Jang

(10) Patent No.: US 12,255,132 B2
(45) Date of Patent: Mar. 18, 2025

(54) SEMICONDUCTOR MEMORY DEVICE AND METHOD OF MANUFACTURING THE SEMICONDUCTOR MEMORY DEVICE

(71) Applicant: SK hynix Inc., Icheon-si (KR)

(72) Inventor: Jung Shik Jang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 493 days.

(21) Appl. No.: 17/380,447

(22) Filed: Jul. 20, 2021

(65) Prior Publication Data

US 2022/0254716 A1  Aug. 11, 2022

(30) Foreign Application Priority Data

Feb. 9, 2021  (KR) ................. 10-2021-0018396

(51) Int. Cl.
*H01L 23/522* (2006.01)
*H10B 43/27* (2023.01)

(52) U.S. Cl.
CPC ......... *H01L 23/5226* (2013.01); *H10B 43/27* (2023.02)

(58) Field of Classification Search
CPC ........ H10B 41/27; H10B 43/27; H10B 41/50; H10B 43/50; H01L 21/76877; H01L 21/76897; H01L 21/76849; H01L 21/7685; H01L 21/76895
See application file for complete search history.

(56) References Cited

U.S. PATENT DOCUMENTS

| | | | |
|---|---|---|---|
| 8,541,831 B2 * | 9/2013 | Chae | H10B 43/20 257/329 |
| 9,373,540 B2 * | 6/2016 | Hyun | H10B 41/50 |
| 9,853,038 B1 * | 12/2017 | Cui | H10B 43/35 |
| 9,941,153 B1 * | 4/2018 | Yang | H01L 21/76816 |
| 10,192,929 B2 | 1/2019 | Mori | |
| 10,403,641 B2 * | 9/2019 | Kim | H01L 21/76877 |
| 10,763,167 B2 * | 9/2020 | Lee | H10B 43/50 |
| 11,171,151 B2 * | 11/2021 | Kang | H10B 43/27 |
| 2018/0166462 A1 * | 6/2018 | Kim | H10B 43/35 |
| 2019/0363014 A1 * | 11/2019 | Lee | H10B 43/50 |
| 2020/0091071 A1 * | 3/2020 | Lee | H01L 21/76832 |
| 2020/0119044 A1 * | 4/2020 | Baek | H01L 24/08 |
| 2021/0020648 A1 * | 1/2021 | Lim | H10B 41/27 |
| 2021/0159239 A1 * | 5/2021 | Kato | H10B 43/50 |
| 2021/0183771 A1 * | 6/2021 | Lee | H01L 23/5283 |
| 2021/0287989 A1 * | 9/2021 | Greenlee | H10B 41/35 |
| 2022/0128900 A1 * | 4/2022 | Kim | G03F 7/70416 |
| 2022/0173040 A1 * | 6/2022 | Wang | H01L 21/76895 |

FOREIGN PATENT DOCUMENTS

KR  102134912 B1  7/2020

* cited by examiner

*Primary Examiner* — Joseph C. Nicely
*Assistant Examiner* — E. Rhett Cheek
(74) *Attorney, Agent, or Firm* — WILLIAM PARK & ASSOCIATES LTD.

(57) ABSTRACT

A semiconductor memory device includes a first conductive pattern, a second conductive pattern configured to overlap a first line component of the first conductive pattern and to leave exposed a first pad component of the first conductive pattern. The semiconductor memory device also includes an interlayer insulating layer between the first conductive pattern and the second conductive pattern. The semiconductor memory device further includes a first conductive contact and a first insulating pillar extending from the first pad component of the first conductive pattern in opposite directions.

21 Claims, 33 Drawing Sheets

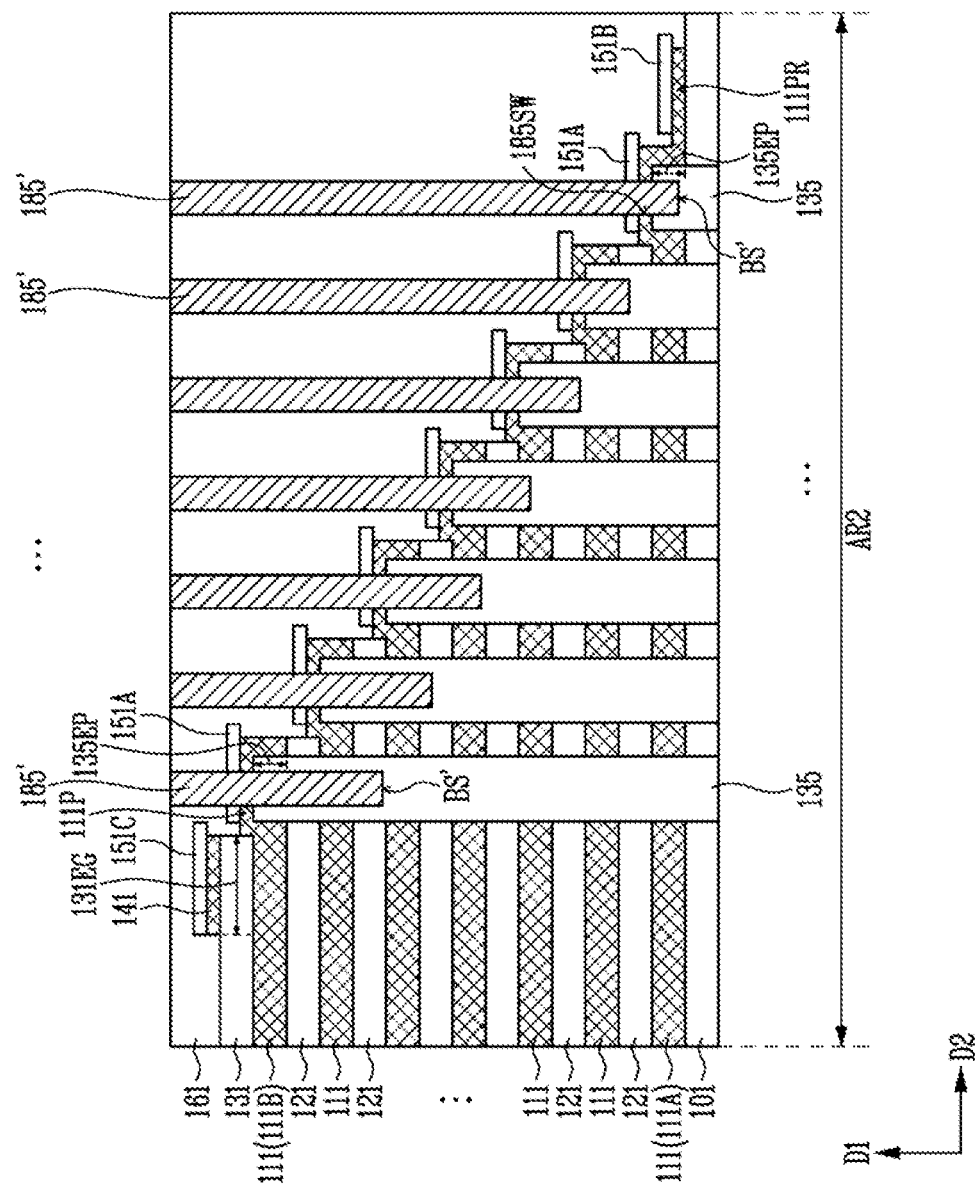

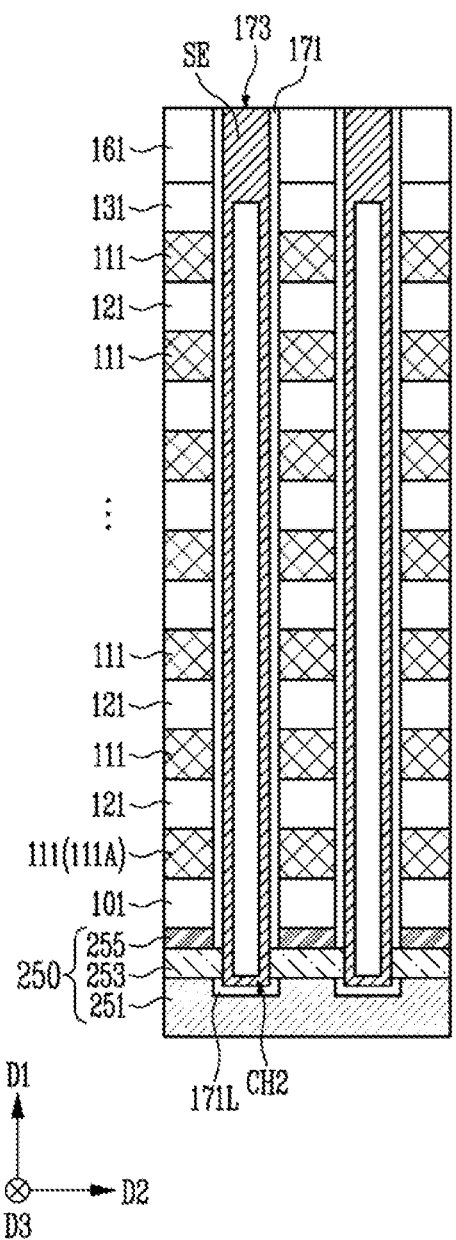

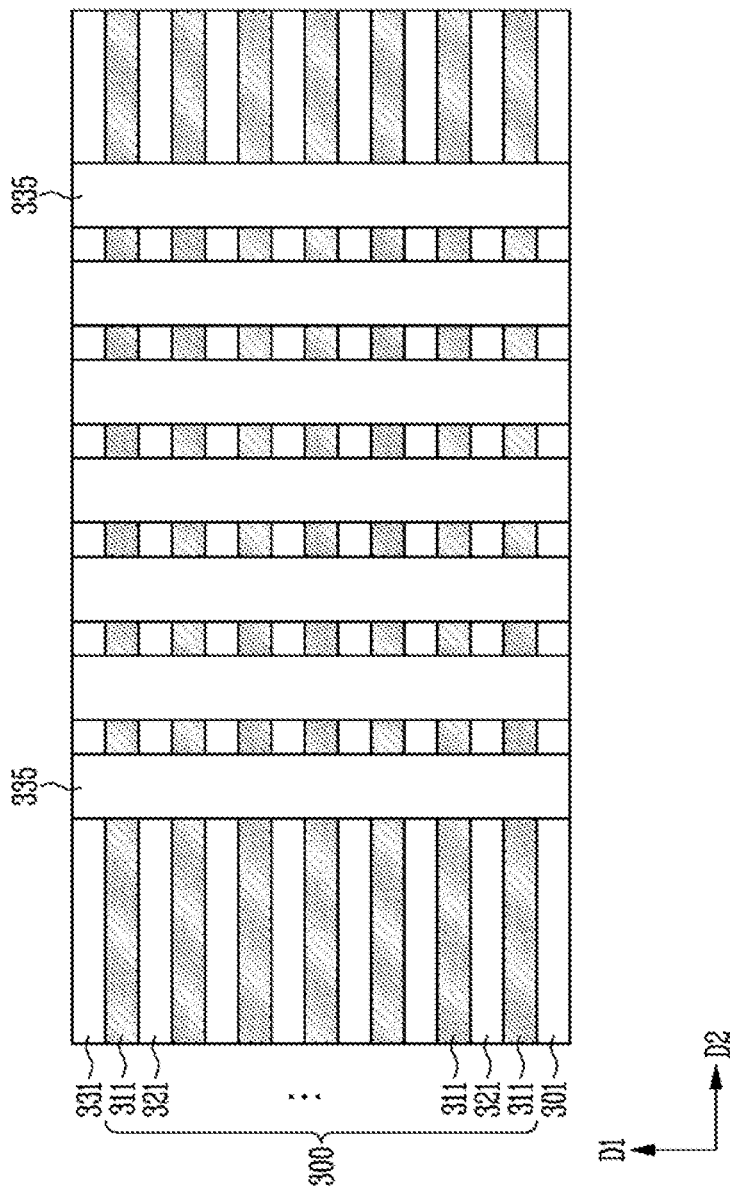

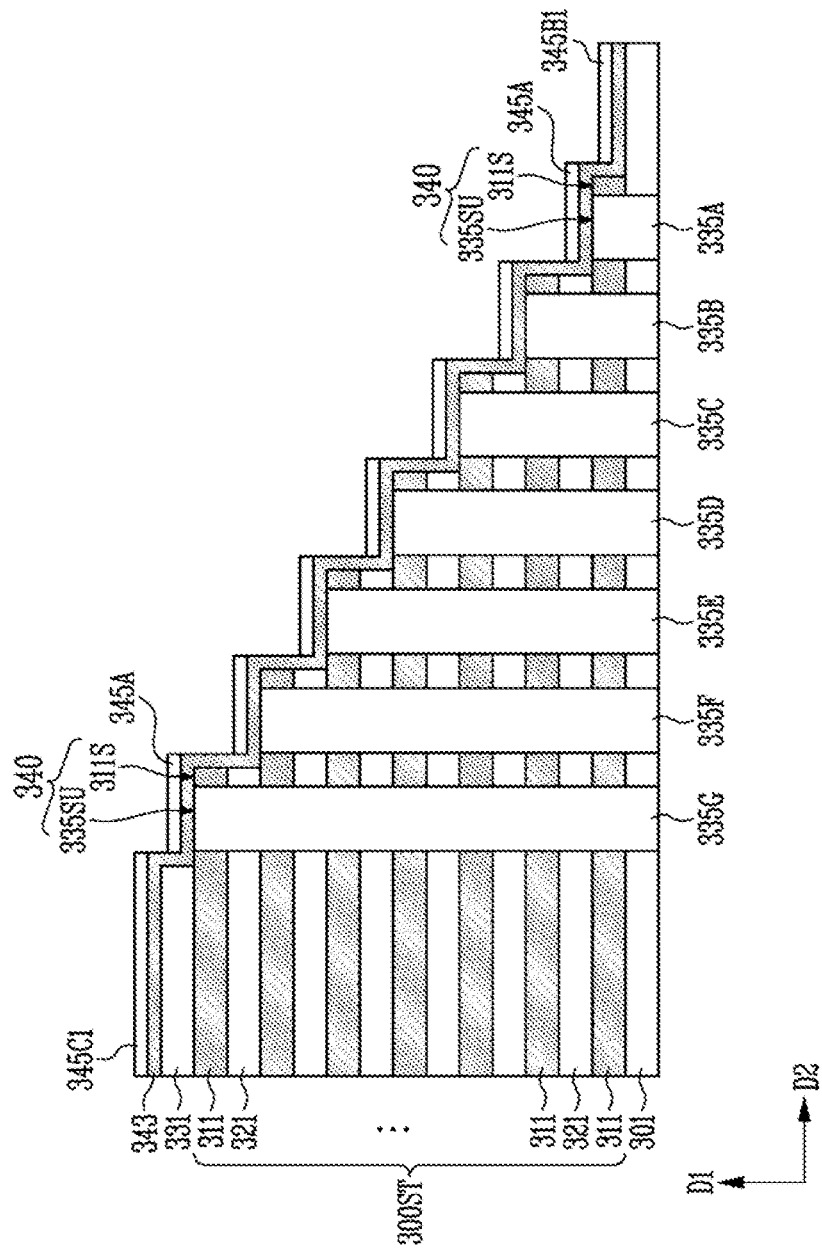

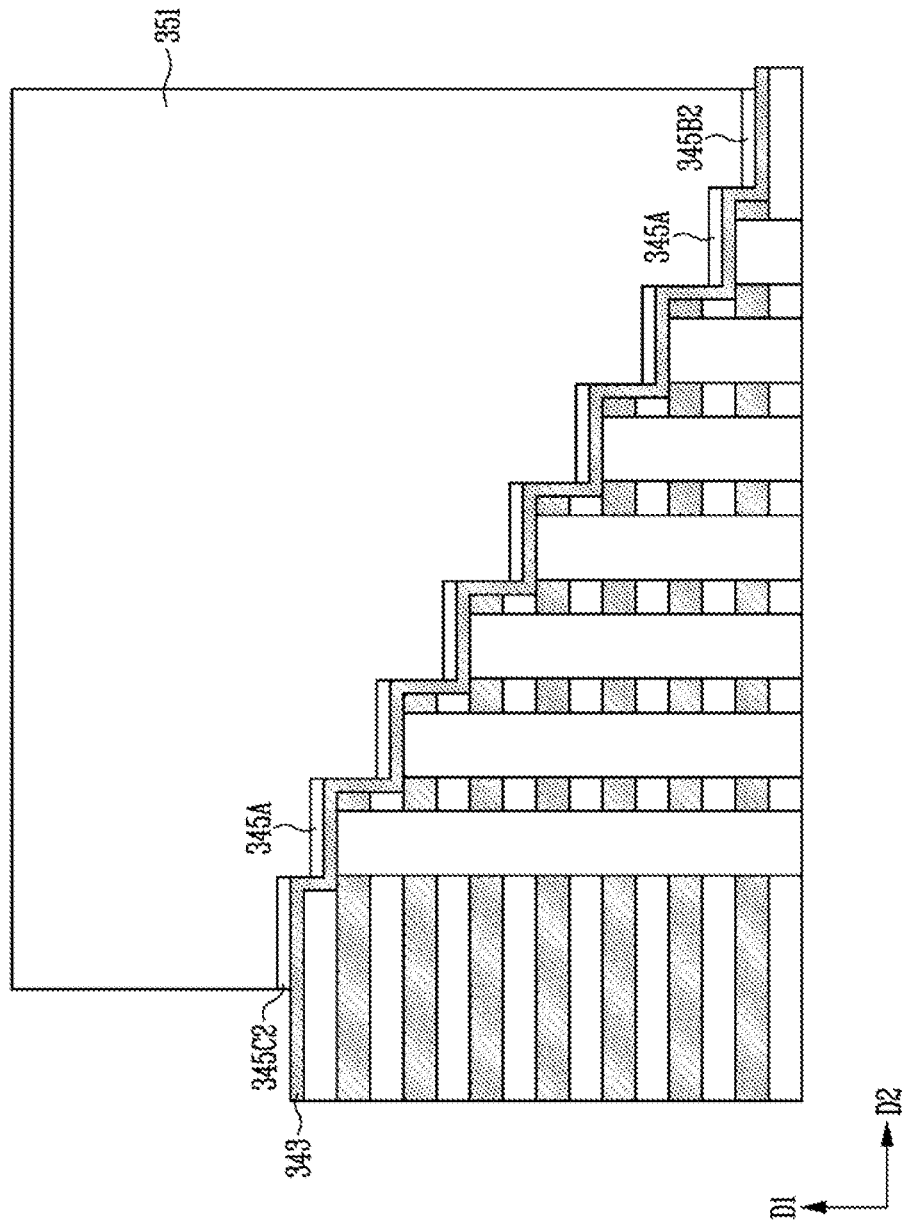

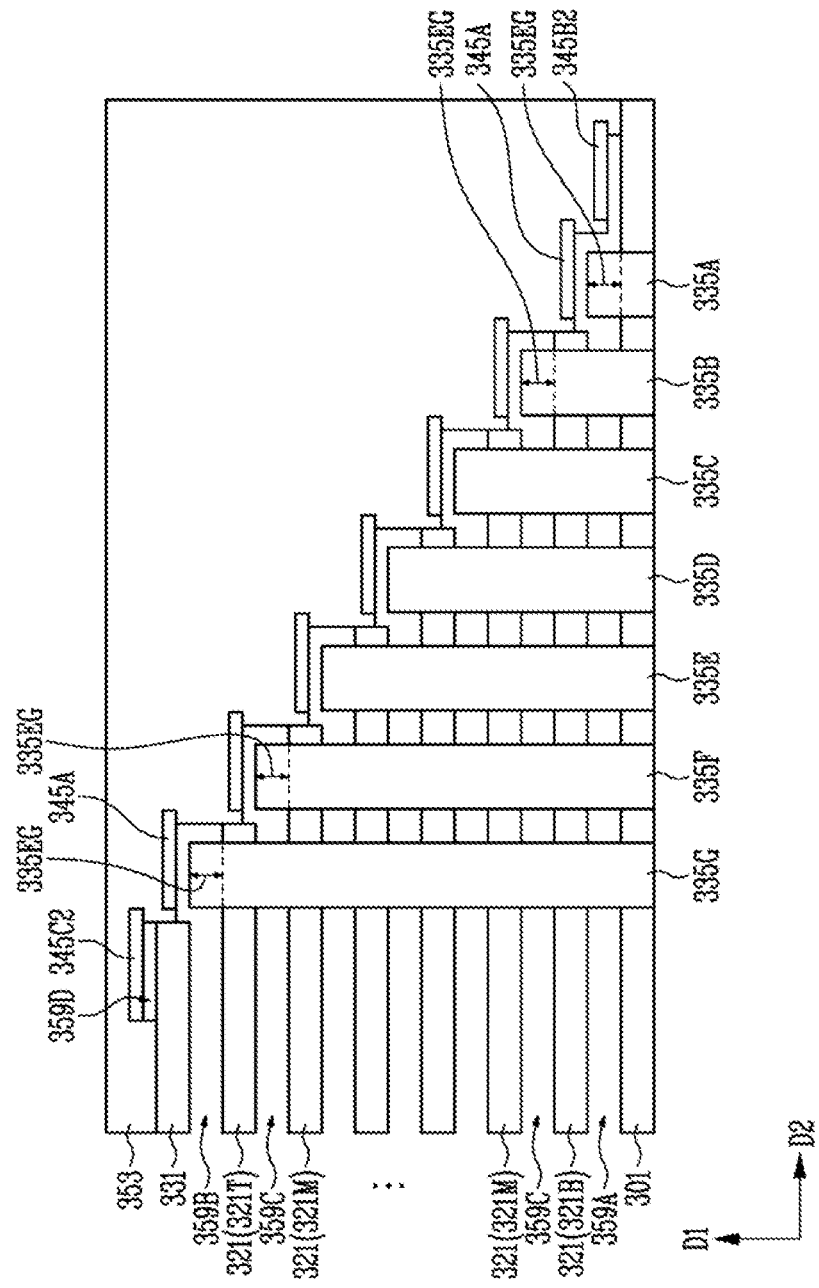

SEMICONDUCTOR MEMORY DEVICE AND METHOD OF MANUFACTURING THE SEMICONDUCTOR MEMORY DEVICE

CROSS-REFERENCE TO RELATED APPLICATION

The present application claims priority under 35 U.S.C. § 119(a) to Korean patent application number 10-2021-0018396 filed on Feb. 9, 2021, in the Korean Intellectual Property Office, the entire disclosure of which is incorporated by reference herein.

BACKGROUND

1. Technical Field

Various embodiments of the present disclosure may relate to a semiconductor memory device and a method of manufacturing the semiconductor memory device, and more particularly, to a three-dimensional semiconductor memory device and a method of manufacturing the three-dimensional semiconductor memory device.

2. Related Art

A semiconductor memory device includes a memory cell array and a peripheral circuit structure coupled to the memory cell array. The memory cell array includes a plurality of memory cells capable of storing data. The peripheral circuit structure may supply various operating voltages to the memory cells and may control various operations of the memory cells.

To increase the degree of integration of semiconductor memory devices, a three-dimensional semiconductor memory device has been proposed. The memory cells of the three-dimensional semiconductor memory device may be arranged in three dimensions. Thus, the three-dimensional semiconductor memory device may reduce a two-dimensional area occupied by the memory cells.

SUMMARY

An embodiment of the present disclosure may provide for a semiconductor memory device, including a first conductive pattern including a first line component and a first pad component extending from the first line component; a second conductive pattern overlapping the first line component of the first conductive pattern and leaving the first pad component of the first conductive pattern exposed, the second conductive pattern spaced apart from the first conductive pattern in a first direction; an interlayer insulating layer between the first conductive pattern and the second conductive pattern; a first conductive contact extending from the first pad component of the first conductive pattern in the first direction; and a first insulating pillar overlapped by the first conductive contact and extending from the first pad component in a direction opposite to the first direction.

An embodiment of the present disclosure may provide for a semiconductor memory device, including a first insulating layer including a cell array region and a contact region; insulating pillars passing through the first insulating layer in the contact region and extending to different lengths in a first direction; conductive patterns including pad components that enclose ends of the insulating pillars at different levels above the first insulating layer, respectively; and conductive contacts overlapping the insulating pillars, respectively, and coming into contact with the pad components, respectively.

An embodiment of the present disclosure may provide for a method of manufacturing a semiconductor memory device, including forming an insulating layer; forming insulating pillars passing through the insulating layer and having different lengths in a first direction intersecting with a surface of the insulating layer; forming conductive patterns overlapping the insulating layer and enclosing ends of the insulating pillars, respectively, at different levels; and forming conductive contacts overlapping the insulating pillars, respectively, and coupled to the conductive patterns.

An embodiment of the present disclosure may provide for a method of manufacturing a semiconductor memory device, including forming a stacked body including first material layers and second material layers that are alternately stacked in a first direction; forming preliminary insulating pillars passing through the stacked body; etching the preliminary insulating pillars to form insulating pillars having different lengths in the first direction; etching the first material layers and the second material layers to form a stepped structure having steps formed of upper surfaces of the first material layers; forming pad patterns on the upper surfaces of the first material layers; forming an upper insulating layer covering the pad patterns and the stepped structure; and forming conductive contacts passing through the upper insulating layer and overlapping the insulating pillars.

BRIEF DESCRIPTION OF THE DRAWINGS

FIG. 8 is a sectional view illustrating a contact region of a semiconductor memory device in accordance with an embodiment of the present disclosure.

FIGS. 9A and 9B are sectional views illustrating semiconductor memory devices in accordance with embodiments of the present disclosure.

FIGS. 10A and 10B are diagrams illustrating an example of a process of forming a stacked body and preliminary insulating pillars in accordance with the present disclosure.

FIGS. 12A, 12B, 13A, 13B, 14A, 14B, 15A, and 15B are diagrams illustrating an example of a process of forming pad patterns in accordance with the present disclosure.

FIGS. 17A, 17B, 18A, and 18B are diagrams illustrating an example of a process of forming conductive patterns in accordance with the present disclosure.

DETAILED DESCRIPTION

Specific structural and functional descriptions disclosed herein are merely illustrative for the purpose of describing embodiments according to the concept of the present disclosure. Embodiments according to the concept of the present disclosure can be implemented in various forms, and they should not be construed as being limited to the specific embodiments set forth herein.

It will be understood that, although the terms "first", "second", etc. may be used herein to describe various elements, these elements are not limited by these terms. These terms are used for distinguishing one element from another element and not to suggest a number or order of elements.

Various embodiments of the present disclosure are directed to a semiconductor memory device and a method of manufacturing the semiconductor memory device, where the method and device are capable of improving the stability of a manufacturing process and increasing operational reliability.

Figure 1:
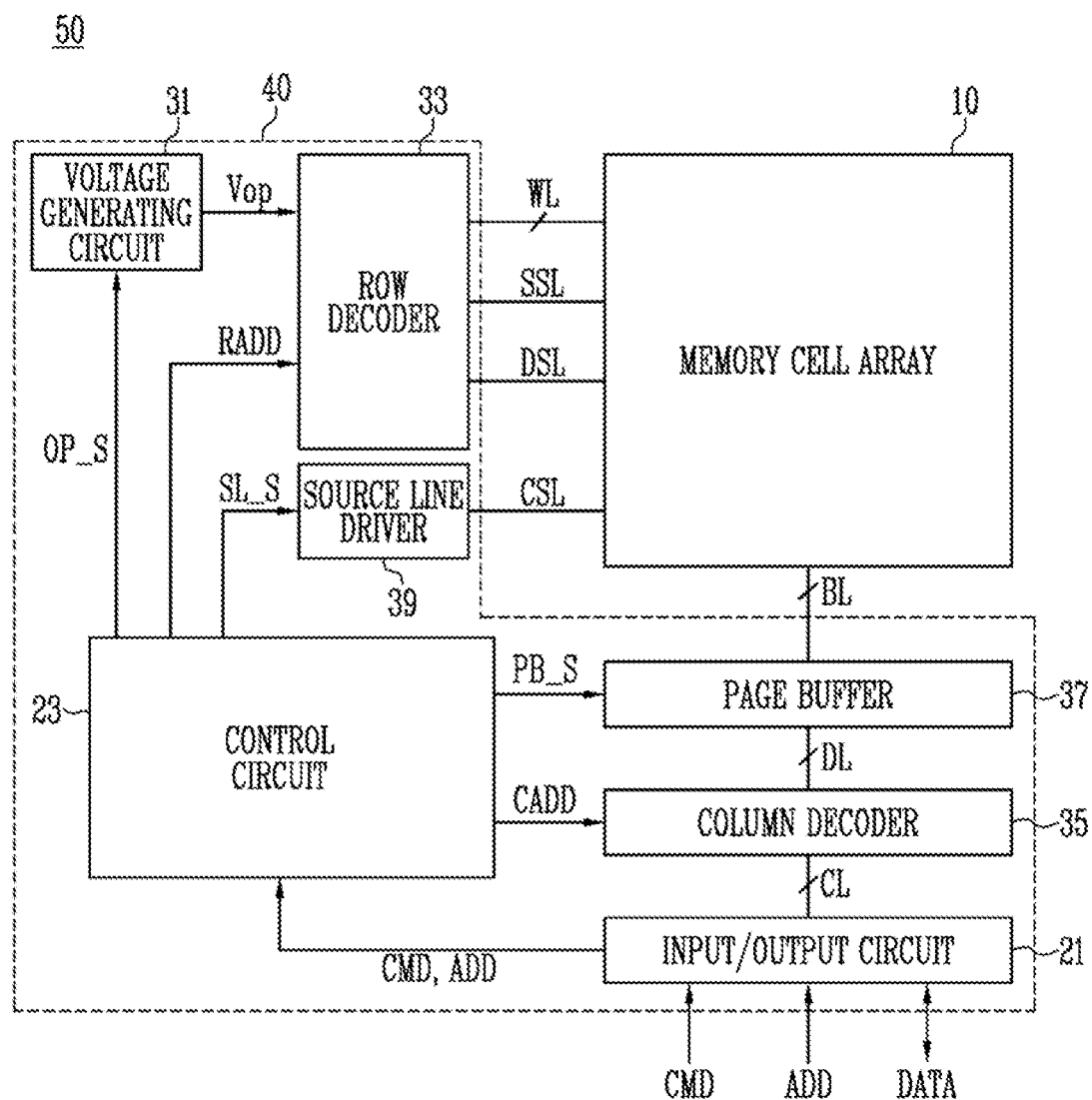
FIG. 1 is a block diagram illustrating a semiconductor memory device in accordance with an embodiment of the present disclosure.

FIG. 1 is a block diagram illustrating a semiconductor memory device 50 in accordance with an embodiment of the present disclosure.

Referring to FIG. 1, the semiconductor memory device 50 may include a peripheral circuit structure 40 and a memory cell array 10.

The peripheral circuit structure 40 may be configured to perform a program operation for storing data in the memory cell array 10, a read operation for outputting data stored in the memory cell array 10, or an erase operation for erasing data stored in the memory cell array 10. In an embodiment, the peripheral circuit structure 40 may include an input/output circuit 21, a control circuit 23, a voltage generating circuit 31, a row decoder 33, a column decoder 35, a page buffer 37, and a source line driver 39.

The memory cell array 10 may include a plurality of memory cells in which data is stored. The memory cells may be arranged in three dimensions. The memory cell array 10 may be coupled to a drain select line DSL, a plurality of word lines WL, a source select line SSL, a plurality of bit lines BL, and a common source line CSL.

The input/output circuit 21 may transmit a command CMD and an address ADD, received from an external device (e.g. a memory controller) of the semiconductor memory device 50, to the control circuit 23. The input/output circuit 21 may exchange data DATA with the external device and a column decoder 35.

The control circuit 23 may output an operation signal OP_S, a row address RADD, a source line control signal SL_S, a page buffer control signal PB_S, and a column address CADD, in response to the command CMD and the address ADD.

The voltage generating circuit 31 may generate various operating voltages Vop used in the program operation, the read operation, and the erase operation, in response to the operation signal OP_S.

The row decoder 33 may deliver the operating voltages Vop to the drain select line DSL, the word lines WL, and the source select line SSL in response to the row address RADD.

The column decoder 35 may transmit the data DATA input from the input/output circuit 21 to the page buffer 37, or may transmit the data DATA stored in the page buffer 37 to the input/output circuit 21, in response to the column address CADD. The column decoder 35 may exchange the data DATA with the input/output circuit 21 through column lines CL. The column decoder 35 may exchange the data DATA with the page buffer 37 through data lines DL.

The page buffer 37 may temporarily store the data DATA received through the bit lines BL, in response to the page buffer control signal PB_S. The page buffer 37 may sense voltage or current of the bit lines BL during the read operation.

The source line driver 39 may control voltage applied to the common source line CSL, in response to the source line control signal SL_S.

To increase the degree of integration of the semiconductor memory device, the memory cell array 10 may overlap the peripheral circuit structure 40.

Figure 2A:
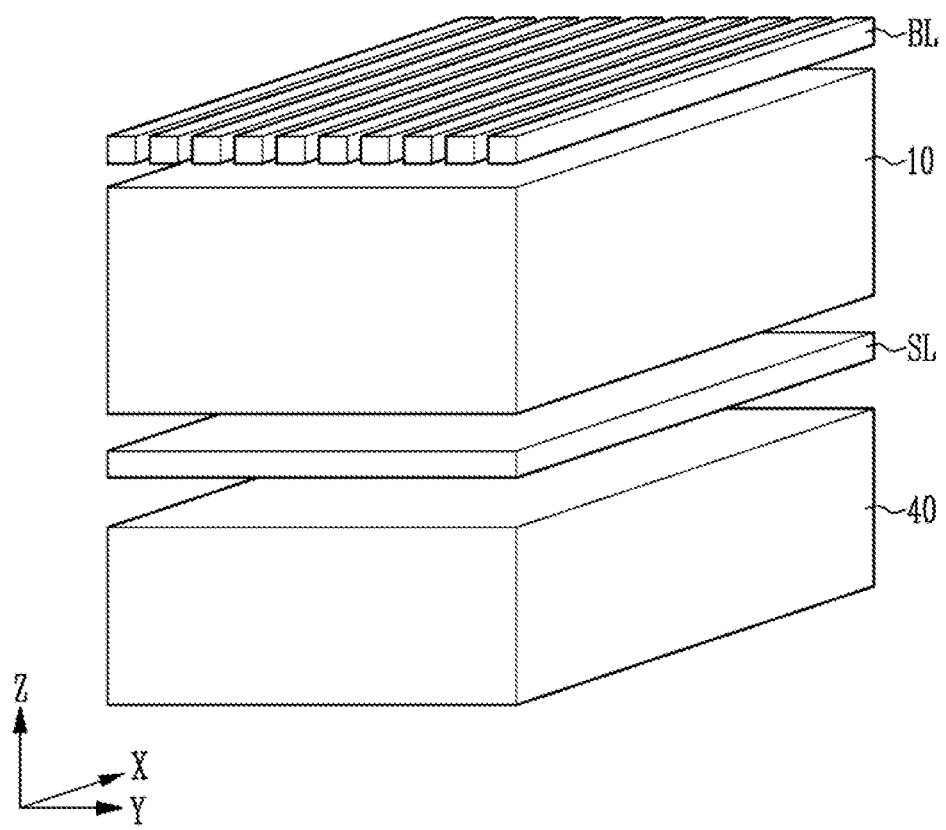
FIGS. 2A and 2B are diagrams schematically illustrating an arrangement of a peripheral circuit structure, a memory cell array, a plurality of bit lines, and a source layer in accordance with embodiments of the present disclosure.
Figure 2B:
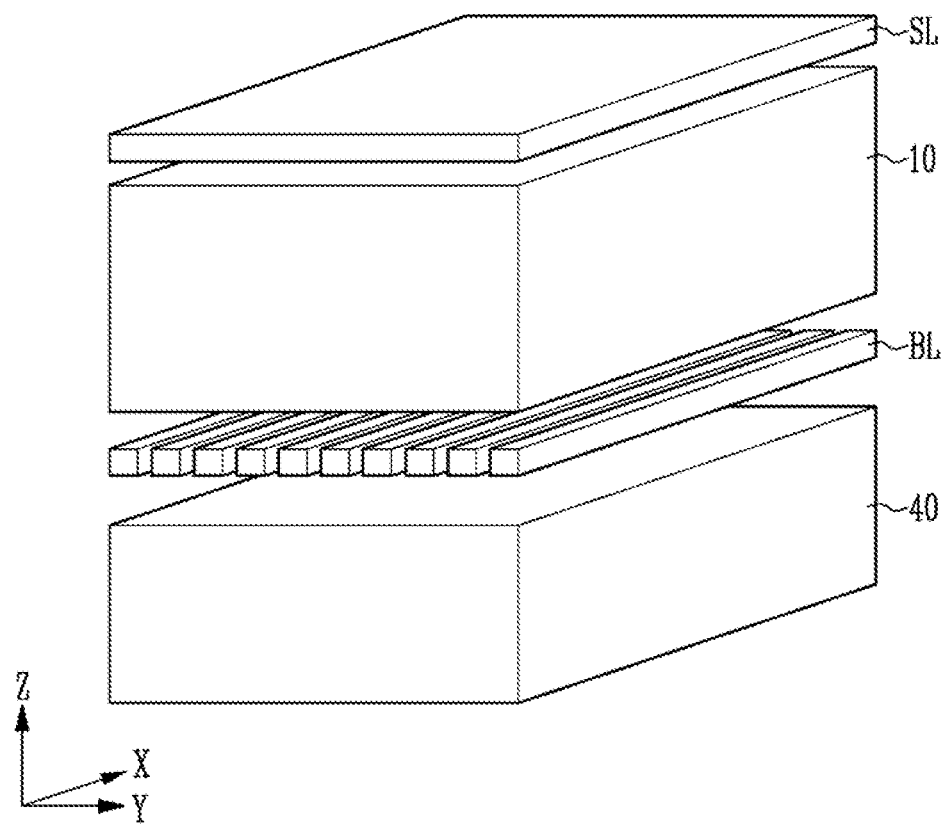

FIGS. 2A and 2B are diagrams schematically illustrating the arrangement of a peripheral circuit structure 40, a memory cell array 10, a plurality of bit lines BL, and a source layer SL in accordance with embodiments of the present disclosure.

Referring to FIGS. 2A and 2B, the peripheral circuit structure 40 may be disposed on a substrate extending in an X-Y plane. The memory cell array 10, the source layer SL, and the plurality of bit lines BL may overlap the peripheral circuit structure 40. The memory cell array 10 may be disposed between the source layer SL and the plurality of bit lines BL.

The source layer SL and the plurality of bit lines BL may be coupled to the memory cell array 10 through channel structures. In an embodiment, the source layer SL may be coupled to the peripheral circuit structure 40 via the common source line CSL shown in FIG. 1. In an embodiment, the source layer SL may constitute the common source line CSL shown in FIG. 1.

In a Z-axis direction, the source layer SL, the plurality of bit lines BL, and the memory cell array 10 may be arranged in various ways.

Referring to FIG. 2A, in an embodiment, the source layer SL may be disposed between the memory cell array 10 and the peripheral circuit structure 40. The plurality of bit lines BL may overlap the source layer SL with the memory cell array 10 interposed therebetween. In other words, the source layer SL and the memory cell array 10 may be disposed between the peripheral circuit structure 40 and the plurality of bit lines BL.

Referring to FIG. 2B, in an embodiment, the plurality of bit lines BL may be disposed between the memory cell array 10 and the peripheral circuit structure 40. The source layer SL may overlap the plurality of bit lines BL with the memory cell array 10 interposed therebetween. In other words, the plurality of bit lines BL and the memory cell array 10 may be disposed between the peripheral circuit structure 40 and the source layer SL.

Turning back to FIGS. 2A and 2B, in an embodiment, processes for forming the source layer SL, the plurality of bit lines BL, and the memory cell array 10 may be performed on the peripheral circuit structure 40. In an embodiment, a process for forming the memory cell array 10 may be performed separately from a process for forming the peripheral circuit structure 40. Here, the memory cell array 10 and the peripheral circuit structure 40 may be coupled to each other by a conductive bonding pattern.

Figure 3:
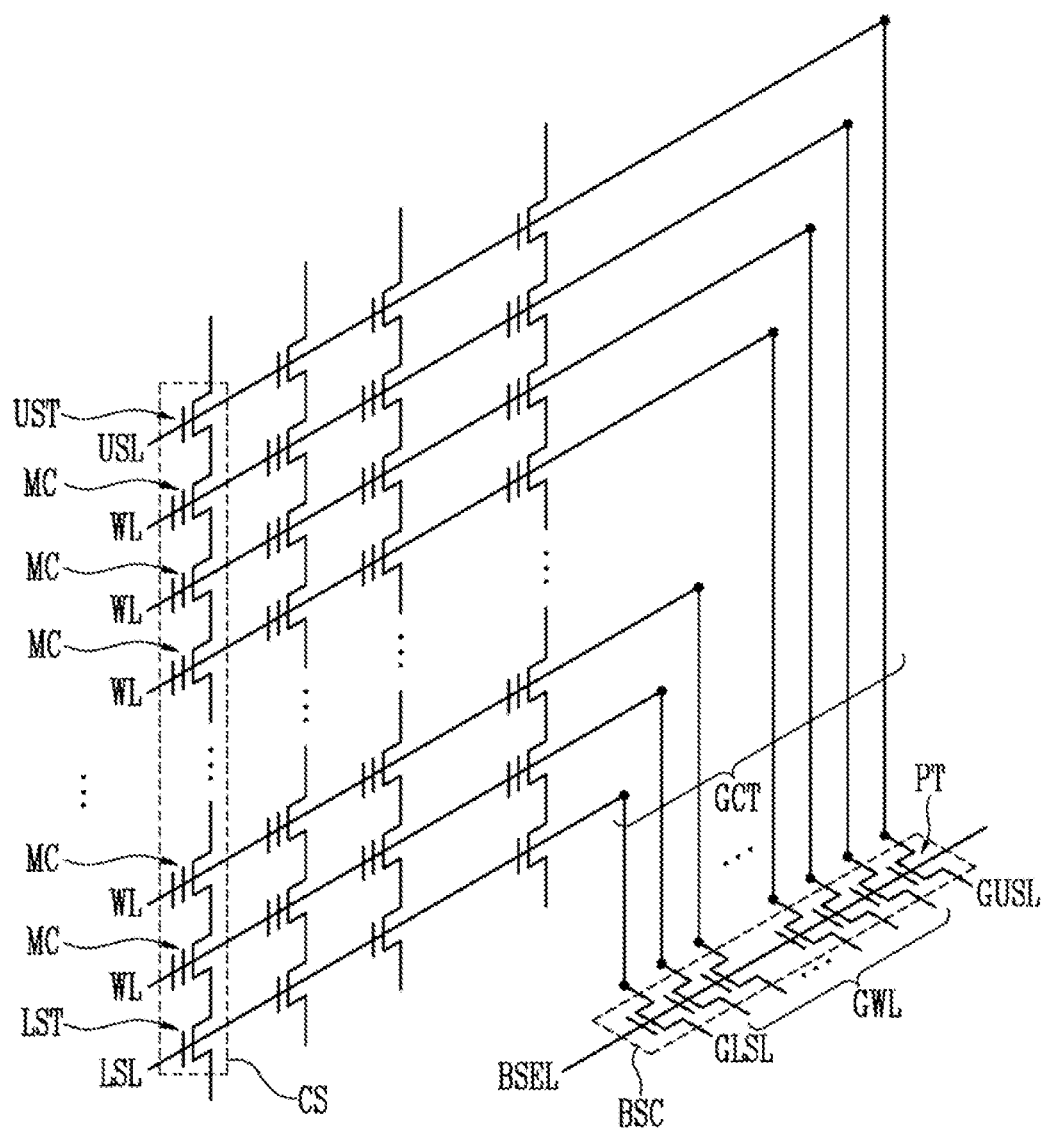
FIG. 3 is a circuit diagram illustrating a memory cell array and a block select circuit structure in accordance with an embodiment of the present disclosure.

FIG. 3 is a circuit diagram illustrating a memory cell array and a block select circuit structure in accordance with an embodiment of the present disclosure.

Referring to FIG. 3, the memory cell array may include a plurality of memory cell strings CS. Each of the memory cell strings CS may include at least one lower select transistor LST, a plurality of memory cells MC, and at least one upper select transistor UST.

The plurality of memory cells MC may be coupled in series between the lower select transistor LST and the upper select transistor UST. One of the lower select transistor LST and the upper select transistor UST may be used as a source select transistor, while the other may be used as a drain select transistor. The plurality of memory cells MC may be coupled through the source select transistor to the source layer SL shown in FIGS. 2A and 2B. The plurality of memory cells MC may be coupled through the drain select transistor to the bit line BL shown in FIGS. 2A and 2B.

The plurality of memory cells MC may be coupled to the word lines WL, respectively. The operation of the plurality of memory cells MC may be controlled by gate signals applied to the word lines WL. The lower select transistor LST may be coupled to the lower select line LSL. The operation of the lower select transistor LST may be controlled by a gate signal applied to the lower select line LSL. The upper select transistor UST may be coupled to the upper select line USL. The operation of the upper select transistor UST may be controlled by a gate signal applied to the upper select line USL. The lower select line LSL, the upper select line USL, and the word lines WL may be implemented by conductive patterns that are stacked while being spaced apart from each other.

The lower select line LSL, the upper select line USL, and the word lines WL may be coupled to a block select circuit structure BSC. The block select circuit structure BSC may be included in the row decoder 33 described with reference to FIG. 1. In an embodiment, the block select circuit structure BSC may include pass transistors PT coupled to the lower select line LSL, the upper select line USL, and the word lines WL, respectively. Gates of the pass transistors PT may be coupled to a block select line BSEL. The pass transistors PT may be configured to transmit voltages applied to global lines GLSL, GUSL, and GWL to the lower select line LSL, the upper select line USL, and the word lines WL in response to a block select signal applied to the block select line BSEL.

The block select circuit structure BSC may be coupled via gate contact structures GCT to the lower select line LSL, the upper select line USL, and the word lines WL. The gate contact structures GCT may include conductive contacts that are in contact with the lower select line LSL, the upper select line USL, and the word lines WL.

Figure 4:
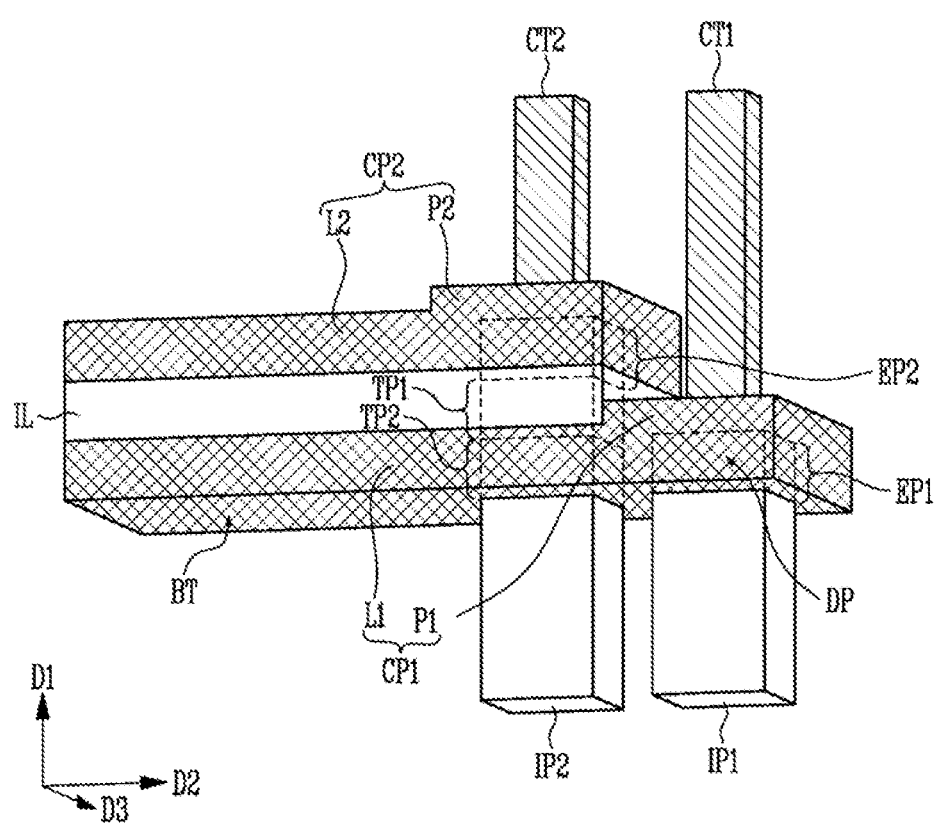
FIG. 4 is a perspective view illustrating a portion of a semiconductor memory device in accordance with an embodiment of the present disclosure.

FIG. 4 is a perspective view illustrating a portion of a semiconductor memory device in accordance with an embodiment of the present disclosure.

Referring to FIG. 4, the semiconductor memory device may include conductive patterns CP1 and CP2, an interlayer insulating layer IL, conductive contacts CT1 and CT2, and insulating pillars IP1 and IP2.

The conductive patterns CP1 and CP2 may be stacked while being spaced apart from each other in a first direction D1. Each of the conductive patterns CP1 and CP2 may extend parallel to a plane that is perpendicular to an axis facing the first direction D1. Hereinafter, directions in which axes intersecting with each other in the plane face are defined as a second direction D2 and a third direction D3.

The conductive patterns CP1 and CP2 may include a first conductive pattern CP1 and a second conductive pattern CP2 forming a portion of the lower select line LSL, the upper select line USL, and the word lines WL shown in FIG. 3. The second conductive pattern CP2 may be spaced apart from the first conductive pattern CP1 in the first direction D1.

The first conductive pattern CP1 may have a first line component L1 and a first pad component P1. The first pad component P1 may extend from the first line component L1 in the second direction D2. The first line component L1 and the first pad component P1 may extend parallel with each other. In an embodiment, the first line component L1 and the first pad component P1 may extend in the third direction D3. The first pad component P1 may form an end of the first conductive pattern CP1. The thickness of the first pad component P1 may be greater than that of the first line component L1 in the first direction D1.

The second conductive pattern CP2 may overlap the first line component L1 of the first conductive pattern CP1, and might not overlap the first pad component P1 of the first conductive pattern CP1. Thus, the first pad component P1 of the first conductive pattern CP1 may be exposed by the second conductive pattern CP2.

The second conductive pattern CP2 may have a second line component L2 and a second pad component P2. The second line component L2 may overlap a portion of the first conductive pattern CP1. In an embodiment, the second line component L2 may overlap a portion of the first line component L1. The second pad component P2 may extend from the second line component L2, and may overlap an end of the first line component L1. The second pad component P2 may be adjacent to the first pad component P1 of the first conductive pattern CP1. The second pad component P2 may form an end of the second conductive pattern CP2. The thickness of the second pad component P2 may be greater than that of the second line component L2 in the first direction D1.

The interlayer insulating layer IL may be disposed between the first conductive pattern CP1 and the second conductive pattern CP2. The first conductive pattern CP1 and the second conductive pattern CP2 may be insulated from each other by the interlayer insulating layer IL. The first pad component P1 of the first conductive pattern CP1 may extend along a portion of a sidewall of the interlayer insulating layer IL.

The conductive contacts CT1 and CT2 may include a first conductive contact CT1 and a second conductive contact CT2 that are coupled to the first conductive pattern CP1 and the second conductive pattern CP2, respectively. The first conductive contact CT1 may be in contact with the first pad component P1 of the first conductive pattern CP1, and may extend from the first pad component P1 in the first direction D1. The second conductive contact CT2 may be in contact with the second pad component P2 of the second conductive pattern CP2, and may extend from the second pad component P2 in the first direction D1. The first conductive contact CT1 and the second conductive contact CT2 may overlap the insulating pillars IP1 and IP2, respectively.

The insulating pillars IP1 and IP2 may include a first insulating pillar IP1 and a second insulating pillar IP2. An area of a cross-section of each of the first insulating pillar IP1 and the second insulating pillar IP2 may be larger than an area of a cross-section of each of the first conductive contact CT1 and the second conductive contact CT2.

The first insulating pillar IP1 may be overlapped by the first conductive contact CT1. The first insulating pillar IP1 and the first conductive contact CT1 may extend in opposite directions from the first pad component P1 of the first conductive pattern CP1. The first insulating pillar IP1 may have a first end EP1 inserted into a depression DP of the first pad component P1. The first pad component P1 may have a bottom BT facing a direction opposite to the first direction D1. The depression DP of the first component P1 may be defined in the bottom BT of the first pad component P1. The thickness of the first pad component P1 may be greater than the depth of the depression DP in the first direction D1.

The second insulating pillar IP2 may be overlapped by the second conductive contact CT2. The second insulating pillar IP2 and the second conductive contact CT2 may extend in opposite directions from the second pad component P2 of the second conductive pattern CP2. Similarly to the first insulating pillar IP1, the second insulating pillar IP2 may have a second end EP2 inserted into a depression of the second pad component P2. The second insulating pillar IP2 may have a first penetration component TP1 extending from the second end EP2, and a second penetration component TP2 extending from the first penetration component TP1. The first penetration component TP1 may be defined as a portion of the second insulating pillar IP2 surrounded by the interlayer insulating layer IL, while the second penetration component TP2 may be defined as a portion of the second insulating pillar IP2 surrounded by the first line component L1 of the first conductive pattern CP1. The second insulating pillar IP2 may protrude farther than the first insulating pillar IP1 in the first direction D1.

According to the above-described embodiment of the present disclosure, it is possible to prevent a failure in which the conductive patterns CP1 and CP2 disposed at different levels are electrically shorted to each other by one of the conductive contacts CT1 and CT2, by using the insulating pillars IP1 and IP2. To be more specific, the second conductive contact CT2 may be coupled to the second conductive pattern CP2, and may extend to a level where the first conductive pattern CP1 is disposed during a process of manufacturing the semiconductor memory device. The second insulating pillar IP2 may be overlapped by the second conductive contact CT2, thus preventing a failure where the second conductive contact CT2 is shorted to the first conductive pattern CP1.

Figure 5:
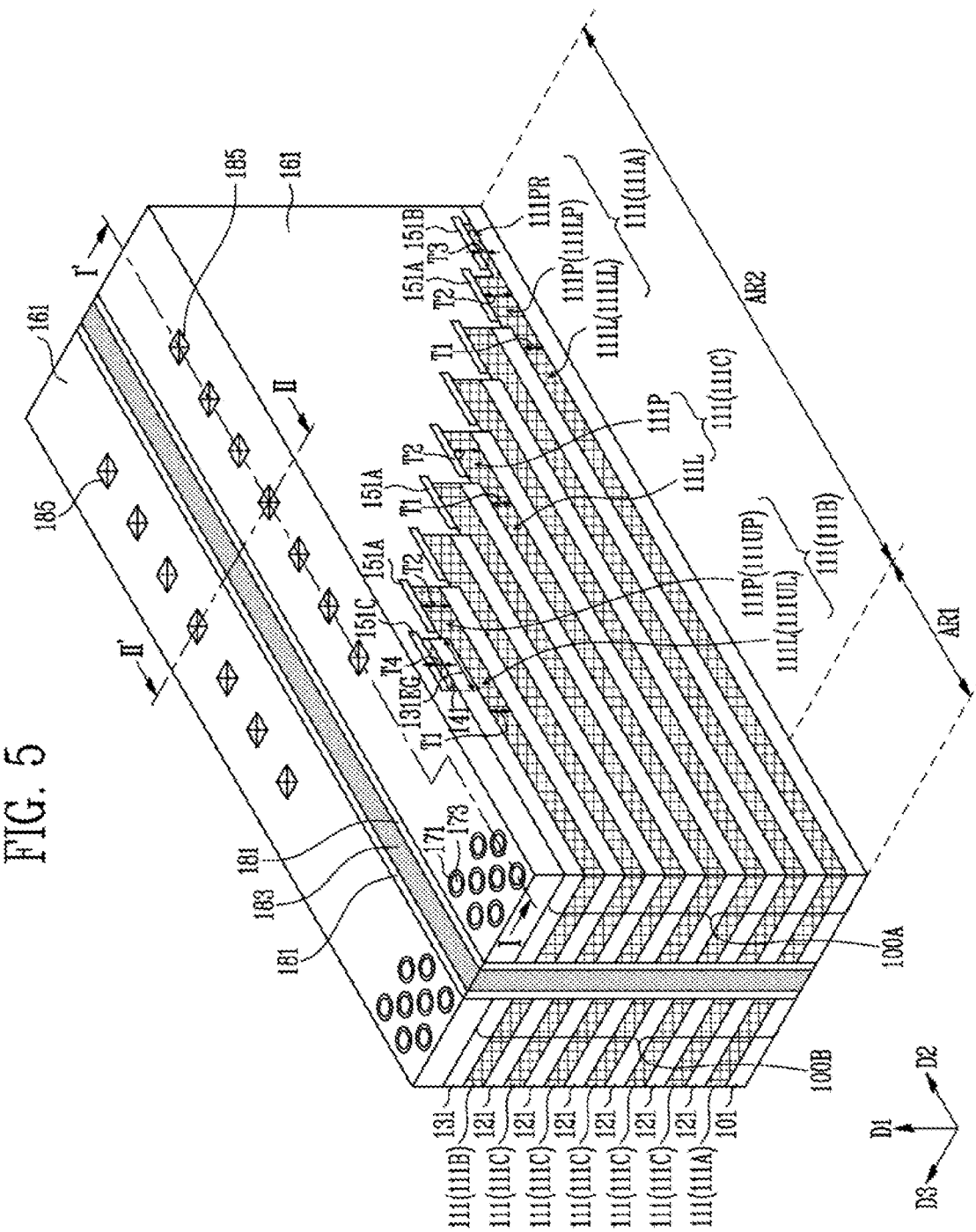
FIG. 5 is a perspective view illustrating a portion of a semiconductor memory device in accordance with an embodiment of the present disclosure.

FIG. 5 is a perspective view illustrating a portion of a semiconductor memory device in accordance with an embodiment of the present disclosure.

Referring to FIG. 5, the semiconductor memory device may include stacked bodies 100A and 100B. Each of the stacked bodies 100A and 100B may include a cell array region AR1 and a contact region AR2. The contact region AR2 may extend from the cell array region AR1. Each of the stacked bodies 100A and 100B may form a stepped structure in the contact region AR2.

Each of the stacked bodies 100A and 100B may include a first insulating layer 101, conductive patterns 111, interlayer insulating layers 121, and a second insulating layer 131. The second insulating layer 131 may be spaced apart from the first insulating layer 101 in the first direction D1. The conductive patterns 111 and the interlayer insulating layers 121 may be disposed between the first insulating layer 101 and the second insulating layer 131. Each of the first insulating layer 101, the conductive patterns 111, the interlayer insulating layers 121, and the second insulating layer 131 may extend parallel to a plane that is perpendicular to the axis facing the first direction D1. In an embodiment, each of the first insulating layer 101, the conductive patterns 111, the interlayer insulating layers 121, and the second insulating layer 131 may extend in the second direction D2 and the third direction D3.

The conductive patterns 111 may be disposed on the first insulating layer 101. The conductive patterns 111 may be spaced apart from the first insulating layer 101 at different distances in the first direction D1. The conductive patterns 111 may include a lower conductive pattern 111A, an upper conductive pattern 111B, and a plurality of intermediate conductive patterns 111C. The lower conductive pattern 111A may be defined as a conductive pattern closest to the first insulating layer 101 among the conductive patterns 111. The lower conductive pattern 111A may come into contact with the first insulating layer 101. The upper conductive pattern 111B may be defined as a conductive pattern farthest from the first insulating layer 101 in the first direction D1. The intermediate conductive patterns 111C may be disposed between the lower conductive pattern 111A and the upper conductive pattern 111B. One of the lower conductive pattern 111A and the upper conductive pattern 111B may be used as the lower select line LSL shown in FIG. 3, while the other may be used as the upper select line USL shown in FIG. 3. The intermediate conductive patterns 111C may be used as the word lines WL shown in FIG. 3.

The conductive patterns 111 may overlap the first insulating layer 101 in the cell array region AR1 and the contact region AR2. The conductive patterns 111 may form a stepped structure in the contact region AR2. In an embodiment, in order to provide the stepped structure, the conductive patterns 111 may have different lengths in the second direction D2 in the contact region AR2. To be more specific, the length of the conductive patterns 111 in the second direction D2 in the contact region AR2 may increase as the conductive patterns 111 come closer to the first insulating layer 101.

The conductive patterns 111 may include line components 111L and pad components 111P. The pad components 111P may overlap the first insulating layer 101 in the contact region AR2. The pad components 111P may be disposed at different levels. The pad components 111P may be disposed so as not to overlap each other. The line components 111L may extend from the pad components 111P towards the cell array region AR1, and may overlap the first insulating layer 101 in the cell array region AR1. In the first direction D1, the thickness T2 of each of the pad components 111P may be greater than the thickness T1 of each of the line components 111L.

The pad components 111P of the upper conductive pattern 111B and the intermediate conductive patterns 111C may form ends of the upper conductive pattern 111B and the intermediate conductive patterns 111C. The pad components 111P of the intermediate conductive patterns 111C might not be covered by the line components 111L and the interlayer insulating layers 121.

The pad component 111P of the lower conductive pattern 111A may be defined as a lower pad component 111LP, and the line component 111L of the lower conductive pattern 111A may be defined as a lower line component 111LL. The pad component 111P of the upper conductive pattern 111B may be defined as an upper pad component 111UP, and the line component 111L of the upper conductive pattern 111B may be defined as an upper line component 111UL.

The lower conductive pattern 111A may have a protrusion 111PR extending in a direction opposite to the lower line component 111LL from the lower pad component 111LP. In the first direction D1, the thickness T3 of the protrusion 111PR may be smaller than the thickness T2 of the lower pad component 111LP. In the first direction D1, the thickness T3 of the protrusion 111PR may be smaller than the thickness T1 of the lower line component 111LL. The protrusion 111PR may form an end of the lower conductive pattern 111A. Embodiments of the present disclosure are not limited thereto. In an embodiment, the protrusion 111PR may be omitted such that the lower pad component 111LP may form an end of the lower conductive pattern 111A.

The second insulating layer 131 may be disposed on the upper line component 111UL of the upper conductive pattern 111B. The upper pad component 111UP of the upper conductive pattern 111B might not be covered by the second insulating layer 131.

The semiconductor memory device may include a dummy conductive pattern 141 disposed on an edge 131EG of the second insulating layer 131. The dummy conductive pattern 141 may overlap the upper line component 111UL with the second insulating layer 131 interposed therebetween. In the first direction D1, the thickness T4 of the dummy conductive pattern 141 may be smaller than the thickness T2 of each of the pad components 111P of the conductive patterns 111. In the first direction D1, the thickness T4 of the dummy conductive pattern 141 may be smaller than the thickness T2 of each of the line components 111L of the conductive patterns 111. Embodiments of the present disclosure are not limited thereto. In an embodiment, the dummy conductive pattern 141 may be omitted.

The first insulating patterns 151 may be disposed on the pad components 111P of the conductive patterns 111, respectively. The first insulating patterns 151A may be spaced apart from the interlayer insulating layers 121 in the second direction D2. Each of the first insulating patterns 151A may protrude farther than the pad component 111P adjacent thereto in the second direction D2.

The second insulating pattern 151B may be disposed on the protrusion 111PR. The second insulating pattern 151B may be spaced apart from the lower pad component 111LP in the second direction D2. The second insulating pattern 151B may protrude farther than the protrusion 111PR in the second direction D2.

The third insulating pattern 151C may be disposed on the dummy conductive pattern 141. The third insulating pattern 151C may protrude farther than the dummy conductive pattern 141 in the second direction D2.

The first insulating patterns 151A, the second insulating pattern 151B, and the third insulating pattern 151C may be disposed at different levels, and might not overlap each other.

Each of the stacked bodies 100A and 100B may be covered with the upper insulating layer 161. The upper insulating layer 161 may cover the stepped structure of each of the stacked bodies 100A and 100B. The upper insulating layer 161 may cover the first insulating patterns 151A, the second insulating pattern 151B, and the third insulating pattern 151C. The upper insulating layer 161 may fill space between the first insulating patterns 151A and the interlayer insulating layers 121. The upper insulating layer 161 may have a substantially flat surface.

The semiconductor memory device may include a channel structure 173 and a memory layer 171 enclosing a sidewall of the channel structure 173. The channel structure 173 and the memory layer 171 may pass through each of the stacked bodies 100A and 100B in the cell array region AR1. Although not shown in the drawing, the memory layer 171 may include a tunnel insulating layer enclosing the sidewall of the channel structure 173, a data storage layer enclosing a sidewall of the tunnel insulating layer, and a blocking insulating layer enclosing a sidewall of the data storage layer. The tunnel insulating layer, the data storage layer, and the blocking insulating layer may extend in the first direction D1. The data storage layer may include a material that may store data changed using Fowler-Nordheim tunneling. In an embodiment, the data storage layer may be formed of a nitride layer capable of trapping charges. The blocking insulating layer may include an oxide capable of blocking charges, and the tunnel insulating layer may include a silicon oxide making charge tunneling possible.

The semiconductor memory device may include a conductive source contact 183 disposed between the stacked bodies 100A and 100B. A sidewall insulating layer 181 may be disposed between each of the stacked bodies 100A and 100B and the conductive source contact 183.

The semiconductor memory device may include conductive contacts 185. The conductive contacts 185 may pass through the upper insulating layer 161 overlapping each of the stacked bodies 100A and 100B in the contact region AR2, and may overlap the pad components 111P, respectively.

Figure 6A:
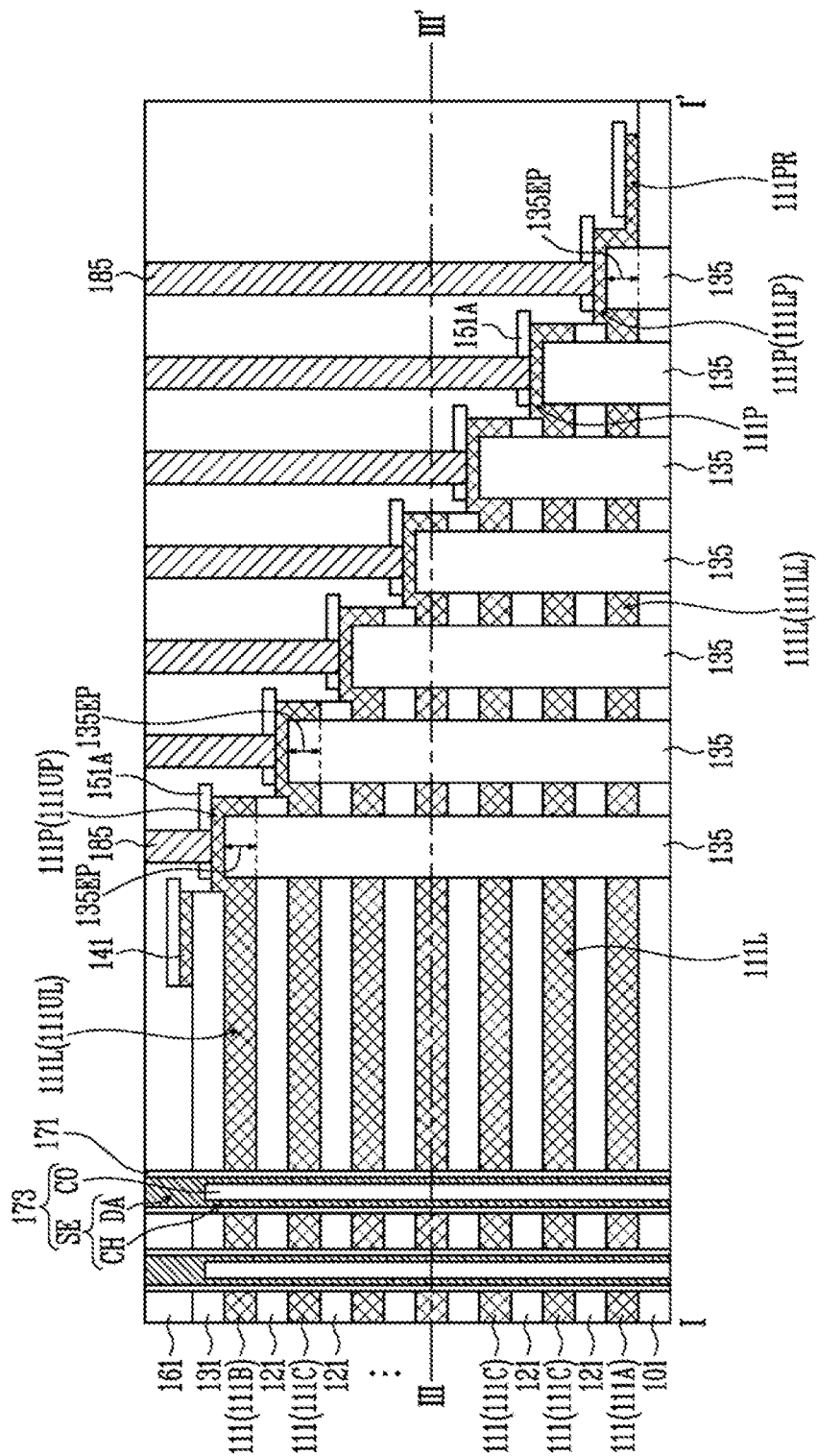
FIGS. 6A and 6B are sectional views of the semiconductor memory device illustrated in FIG. 5.
Figure 6B:
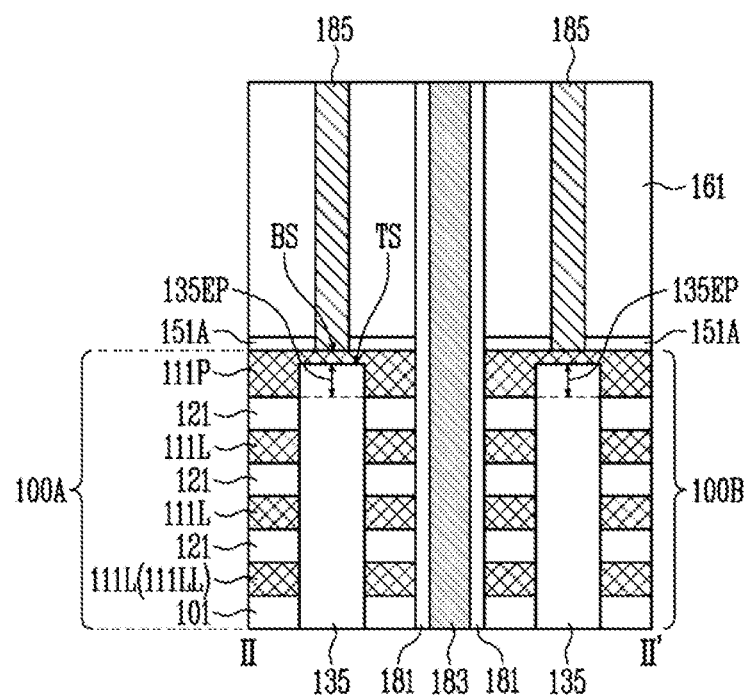

FIGS. 6A and 6B are sectional views of the semiconductor memory device illustrated in FIG. 5. FIG. 6A is a sectional view of the semiconductor memory device taken along line I-I' of FIG. 5, and FIG. 6B is a sectional view of the semiconductor memory device taken along line II-II' of FIG. 5.

Referring to FIGS. 6A and 6B, the semiconductor memory device may include insulating pillars 135. The insulating pillars 135 may pass through the first insulating layer 101 in the contact region AR2 illustrated in FIG. 5, and may extend to different lengths in the first direction D1 illustrated in FIG. 5.

Ends 135EP of the insulating pillars 135 may be disposed at different levels above the first insulating layer 101. The ends 135EP of the insulating pillars 135 may be spaced apart from the line components 111L of the conductive patterns 111. The ends 135EP of the insulating pillars 135 may be enclosed by the pad components 111P of the conductive patterns 111, respectively.

The insulating pillars 135 may be disposed in a region between the upper line component 111UL and the protrusion 111PR. Among the insulating pillars 135, the remaining insulating pillars except for the insulating pillars overlapped by the lower pad component 111LP may pass through at least one of the interlayer insulating layers 121 and the lower line component 111LL. Among the insulating pillars 135, the insulating pillars overlapped by the upper pad component 111UP may pass through the line components 111L of the intermediate conductive patterns 111C. Among the insulating pillars 135, the insulating pillars overlapped by the pad components 111P of the intermediate conductive patterns 111C may pass through at least one of the line components 111L of the intermediate conductive patterns 111C and the lower line component 111LL.

The conductive contacts 185 may overlap the insulating pillars 135, respectively. The conductive contacts 185 may be disposed in a region between the dummy conductive pattern 141 and the protrusion 111PR. The conductive contacts 185 may pass through the upper insulating layer 161 and the first insulating patterns 151A. The conductive contacts 185 may come into contact with the pad components 111P, respectively.

The pad components 111P may extend between top surfaces TS of the insulating pillars 135 and bottom surfaces BS of the conductive contacts 185.

The first insulating patterns 151A may enclose the conductive contacts 185, respectively, and may extend parallel to the pad components 111P.

The memory layer 171 and the channel structure 173 may pass through the first insulating layer 101, the line components 111L of the conductive patterns 111, the interlayer insulating layers 121, the second insulating layer 131, and the upper insulating layer 161.

The channel structure 173 may include a semiconductor layer SE and a core insulating layer CO. The semiconductor layer SE may include a channel region CH and a doped region DA. The channel region CH may be disposed between the core insulating layer CO and the memory layer 171, and the doped region DA may overlap the core insulating layer CO. The semiconductor layer SE may include a semiconductor material such as silicon. The doped region DA may include conductive impurities. In an embodiment, the doped region DA may include an n-type impurity.

The conductive source contact 183 and the sidewall insulating layer 181 between the stacked bodies 100A and 100B may extend along the sidewall of the upper insulating layer 161.

The structure illustrated in FIGS. 5, 6A, and 6B may be applied to the memory cell array 10 illustrated in FIG. 2A or 2B. The structure illustrated in FIGS. 5, 6A, and 6B may be turned upside down to be applied to the memory cell array 10 illustrated in FIG. 2A or 2B.

Figure 7:
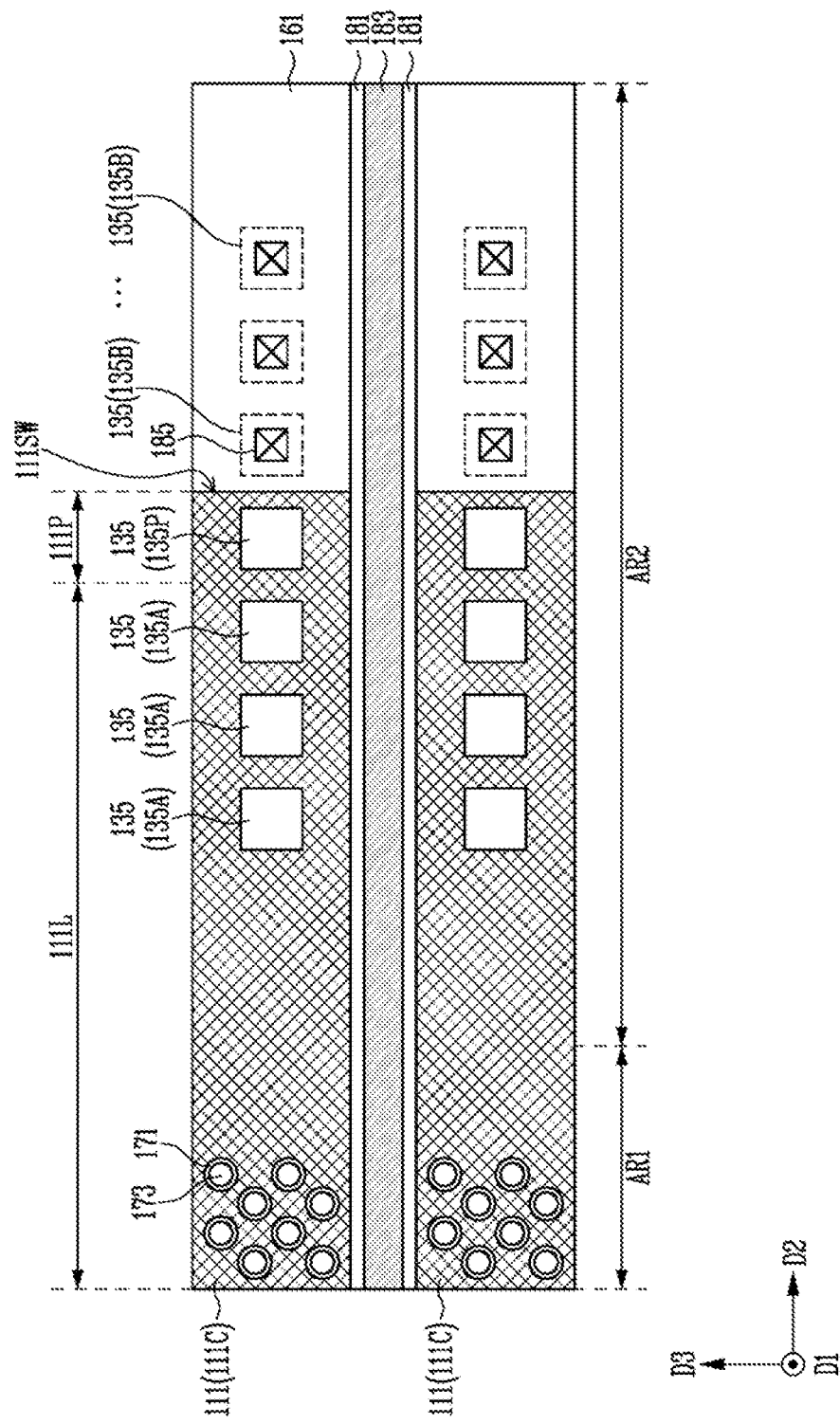
FIG. 7 is a plan view of the semiconductor memory device illustrated in FIG. 5.

FIG. 7 is a plan view of the semiconductor memory device illustrated in FIG. 5. FIG. 7 is a plan view of the semiconductor memory device taken along line III-III' of FIG. 6A.

Referring to FIG. 7, the conductive pattern 111 may be insulated from the conductive source contact 183 by the sidewall insulating layer 181. FIG. 7 illustrates the plan view of the intermediate conductive pattern 111C.

One intermediate conductive pattern 111C may enclose some of the insulating pillars 135. One insulating pillar 135P, which is enclosed by the intermediate conductive pattern 111C and is adjacent to the sidewall 111SW of the intermediate conductive pattern 111C, may be surrounded by the pad component 111P of the intermediate conductive pattern 111C.

The insulating pillars 135A, disposed on a side of the cell array region AR1 with respect to one insulating pillar 135P, may be enclosed by the line component 111L of the intermediate conductive pattern 111C. The line component 111L may extend to the cell array region AR1, and may enclose the channel structure 173 with the memory layer 171 interposed therebetween.

The insulating pillars 135B, disposed to face a direction opposite to that of the cell array region AR1 with respect to one insulating pillar 135P, may be enclosed by at least any one of the conductive patterns disposed under the intermediate conductive pattern 111C.

A cross-sectional area of each of the insulating pillars 135 may be larger than a cross-sectional area of each of the conductive contacts 185. Thus, according to an embodiment of the present disclosure, an overlay margin between the conductive contacts 185 and the insulating pillars 135 may be secured.

FIG. 8 is a sectional view illustrating a contact region of a semiconductor memory device in accordance with an embodiment of the present disclosure. Hereinafter, a repetitive description of duplicated configurations will be omitted.

Referring to FIG. 8, the semiconductor memory device may include a stacked body of the conductive patterns 111 and the interlayer insulating layers 121. The stacked body of the conductive patterns 111 and the interlayer insulating layers 121 may overlap the first insulating layer 101 in the contact region AR2, and may be formed in a stepped structure in the contact region AR2. The second insulating layer 131 may be disposed on the upper conductive pattern 111B among the conductive patterns 111. An edge 131EG of the second insulating layer 131 may be overlapped by the dummy conductive pattern 141.

The first insulating patterns 151A may overlap the pad components 111P of the conductive patterns 111. The second insulating pattern 151B may overlap the protrusion 111PR of the lower conductive pattern 111A among the conductive patterns 111. The third insulating pattern 151C may overlap the dummy conductive pattern 141.

The upper insulating layer 161 may cover the first insulating layer 101, the stacked body of the conductive patterns 111 and the interlayer insulating layers 121, the second insulating layer 131, the dummy conductive pattern 141, the first insulating patterns 151A, the second insulating pattern 151B, and the third insulating pattern 151C.

The insulating pillars 135 may be overlapped by the pad components 111P of the conductive patterns 111, respectively. The insulating pillars 135 may have ends 135EP surrounded with the pad components 111P. The insulating pillars 135 may extend to pass through the first insulating layer 101 from the ends 135EP.

The semiconductor memory device may include conductive contacts 185' overlapping the insulating pillars 135. The conductive contacts 185' may pass through the upper insulating layer 161 and the first insulating patterns 151A, and in addition, may pass through the pad components 111P, respectively. In an embodiment, the conductive contacts 185' may extend into the insulating pillars 135. The conductive contacts 185' may have bottom surfaces BS' that are in contact with the insulating pillars 135. According to an embodiment of the present disclosure, sidewalls 185SW of the conductive contacts 185' may come into contact with the pad components 111P.

Figure 9A:
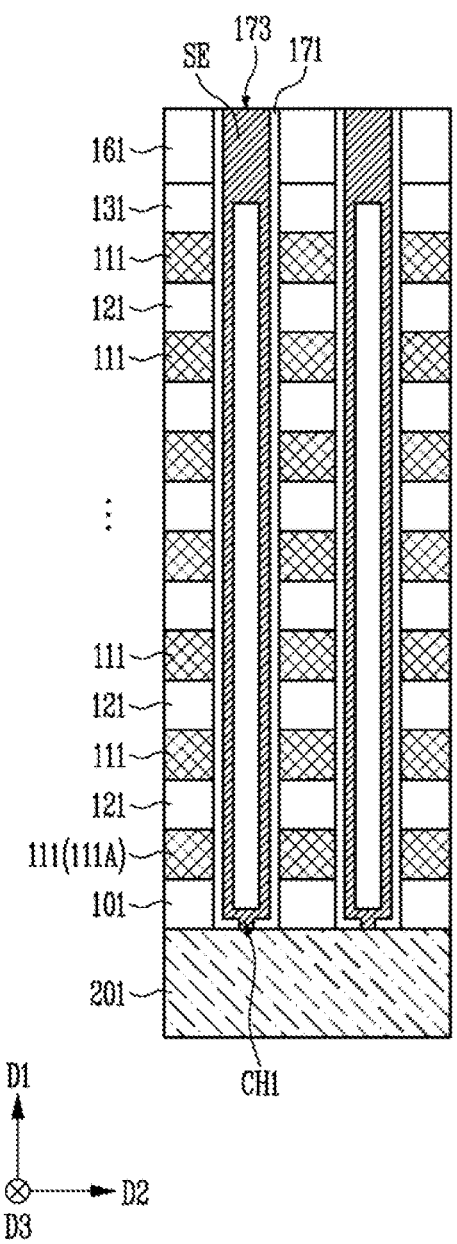

FIGS. 9A and 9B are sectional views illustrating semiconductor memory devices in accordance with embodiments of the present disclosure. FIGS. 9A and 9B are sectional views of the cell array region of the semiconductor memory device. FIGS. 9A and 9B illustrate various embodiments of source layers overlapped by the first insulating layer. Hereinafter, a repetitive description of duplicated configurations will be omitted.

Referring to FIGS. 9A and 9B, the semiconductor memory device may include a source layer 201 or 250. The first insulating layer 101, the conductive patterns 111, the interlayer insulating layers 121, the second insulating layer 131, and the upper insulating layer 161 may overlap the source layer 201 or 250. The semiconductor layer SE of the channel structure 173 may include a channel region CH1 or CH2 coupled to the source layer 201 or 250.

Referring to FIG. 9A, the source layer 201 may include a doped semiconductor material containing a conductive impurity. In an embodiment, the source layer 201 may include n-type doped silicon. The channel region CH1 of the semiconductor layer SE may have a bottom surface that is in contact with the source layer 201. The memory layer 171 may enclose the sidewall of the semiconductor layer SE.

Referring to FIG. 9B, the source layer 250 may include a first doped semiconductor pattern 251, a channel contact pattern 253, and a second doped semiconductor pattern 255. The channel contact pattern 253 may be disposed between the first insulating layer 101 and the first doped semiconductor pattern 251. The second doped semiconductor pattern 255 may be disposed between the first insulating layer 101 and the channel contact pattern 253. Although not shown in the drawing, the second doped semiconductor pattern 255 may be omitted.

The first doped semiconductor pattern 251 may include at least one of an n-type impurity and a p-type impurity. The channel contact pattern 253 may include a doped semiconductor layer containing a conductive impurity. The second doped semiconductor pattern 255 may include the same conductive impurity as that of the channel contact pattern 253. In an embodiment, each of the channel contact pattern 253 and the second doped semiconductor pattern 255 may include n-type doped silicon.

The memory layer 171 and the channel structure 173 may extend to pass through the second doped semiconductor pattern 255. The channel structure 173 may extend into the first doped semiconductor pattern 251. The semiconductor layer SE of the channel structure 173 may come into contact with the channel contact pattern 253. In an embodiment, the channel region CH2 of the semiconductor layer SE may have a sidewall that is in contact with the channel contact pattern 253. The channel region CH2 of the semiconductor layer SE may be inserted into a groove of the first doped semiconductor pattern 251. The semiconductor memory device may further include a dummy memory layer 171L disposed between the first doped semiconductor pattern 251 and the channel region CH2 of the semiconductor layer SE.

Each of the lower conductive patterns 111A of the semiconductor memory devices shown in FIGS. 9A and 9B may be used as a source select line.

Hereinafter, a method of manufacturing a semiconductor memory device in accordance with an embodiment of the present disclosure, focused on a contact region, will be described.

Figure 10A:
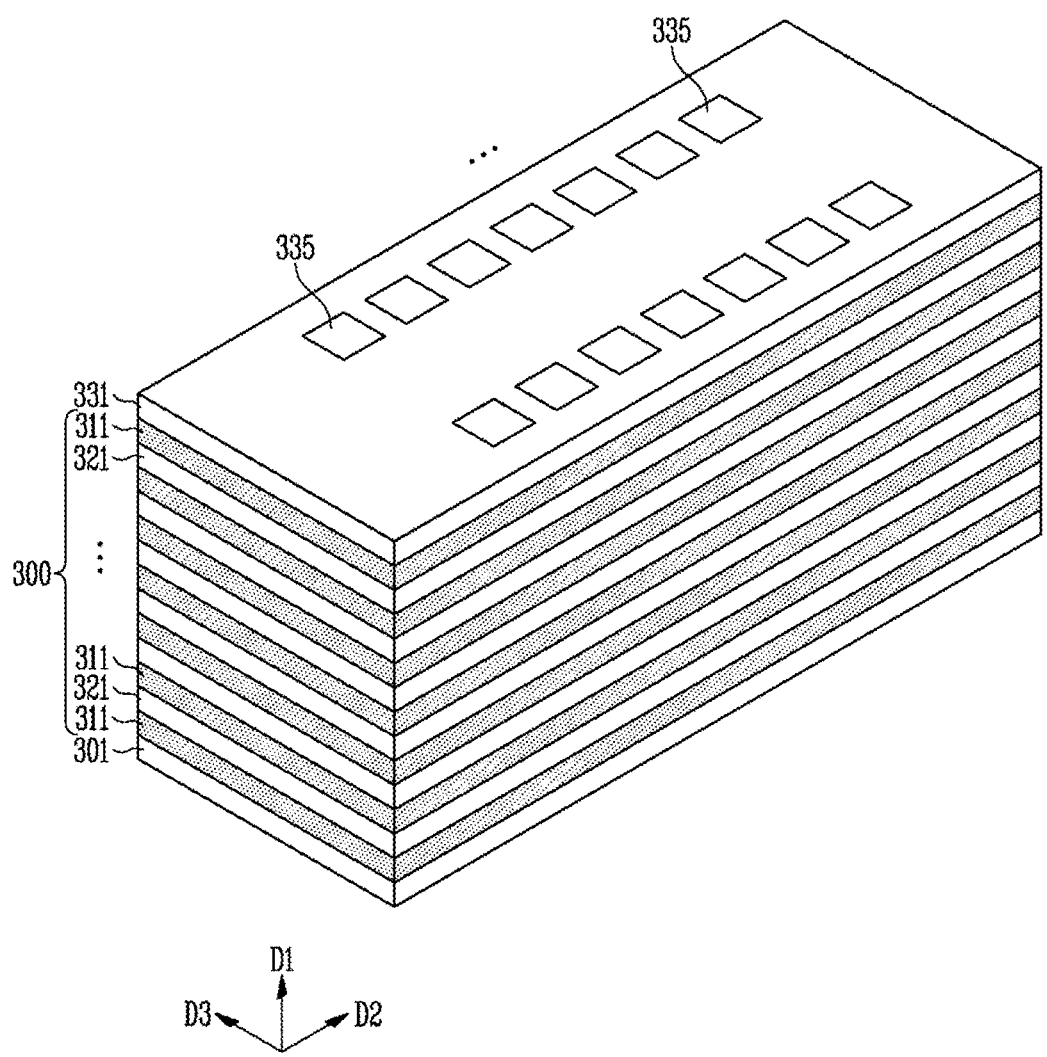

FIGS. 10A and 10B are diagrams illustrating an example of a process of forming a stacked body and preliminary insulating pillars.

Referring to FIGS. 10A and 10B, a first insulating layer 301 may be formed on a previously prepared lower structure (not shown). Various lower structures, such as a substrate, a doped semiconductor layer, or a multilayered structure, are possible. Thereafter, the stacked body 300 may be formed on the first insulating layer 301. The first insulating layer 301 may include an oxide.

The stacked body 300 may be formed by alternately stacking first material layers 311 and second material layers 321 in the first direction D1 intersecting with the surface of the first insulating layer 301. Each of the first material layers 311 and the second material layers 321 may extend in the second direction D2 and the third direction D3 on a plane parallel to the surface of the first insulating layer 301.

The first material layers 311 may be formed of material different from that of the second material layers 321. In an embodiment, each of the first material layers 311 may include a conductive material, and each of the second material layers 321 may include an insulating material. In an embodiment, the first material layers 311 may include an insulating material having an etch selectivity relative to the first insulating layer 301 and the second material layers 321. For example, the first material layers 311 may include a nitride such as silicon nitride, and the second material layers 321 may include an oxide such as silicon oxide.

Subsequently, the second insulating layer 331 may be formed on the stacked body 300. The second insulating layer 331 may be formed of material different from that of the first material layers 311. In an embodiment, the second insulating layer 331 may include an insulating material having an etch selectivity relative to the first material layers 311. For example, the second insulating layer 331 may include an oxide.

Subsequently, preliminary insulating pillars 335 may be formed. The preliminary insulating pillars 335 may pass through the second insulating layer 331, the stacked body 300, and the first insulating layer 301. The preliminary insulating pillars 335 may be spaced apart from each other in the second direction D2 and the third direction D3. The preliminary insulating pillars 335 may be formed of material different from that of the first material layers 311. In an embodiment, the preliminary insulating pillars 335 may include an insulating material having an etch selectivity relative to the first material layers 311. For example, the preliminary insulating pillars 335 may include an oxide.

Figure 11A:
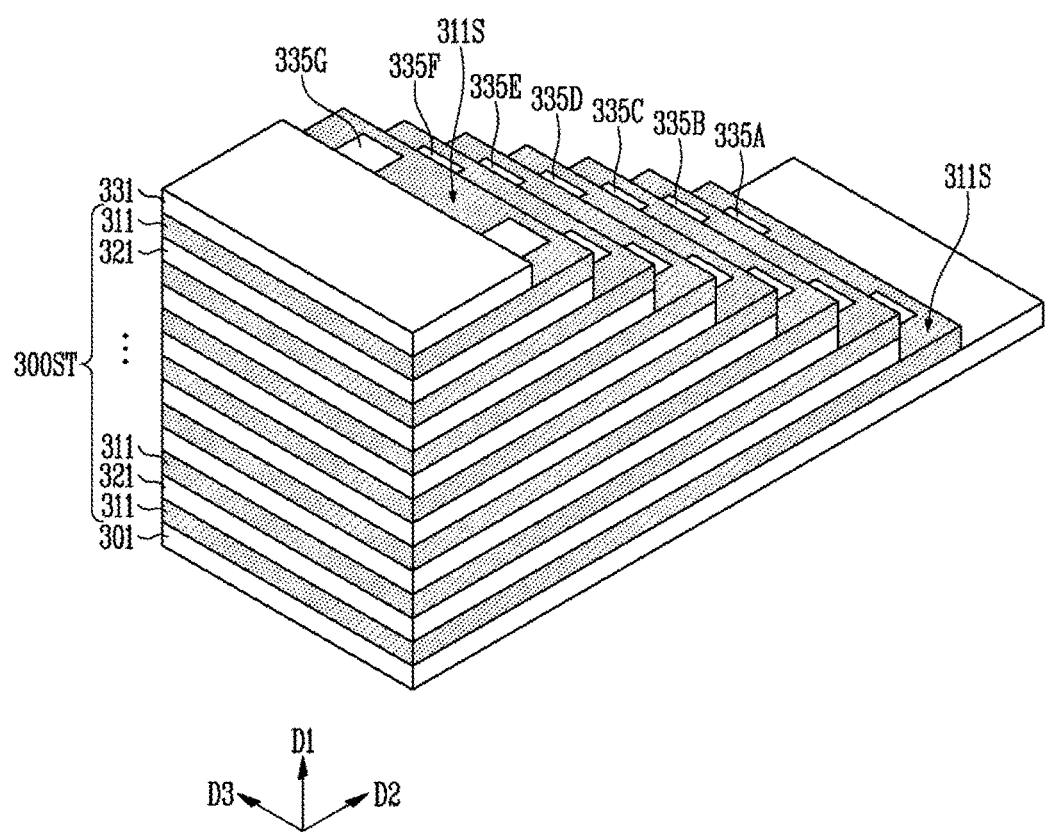
FIGS. 11A and 11B are diagrams illustrating an example of a process of forming insulating pillars and a stepped structure in accordance with the present disclosure.
Figure 11B:
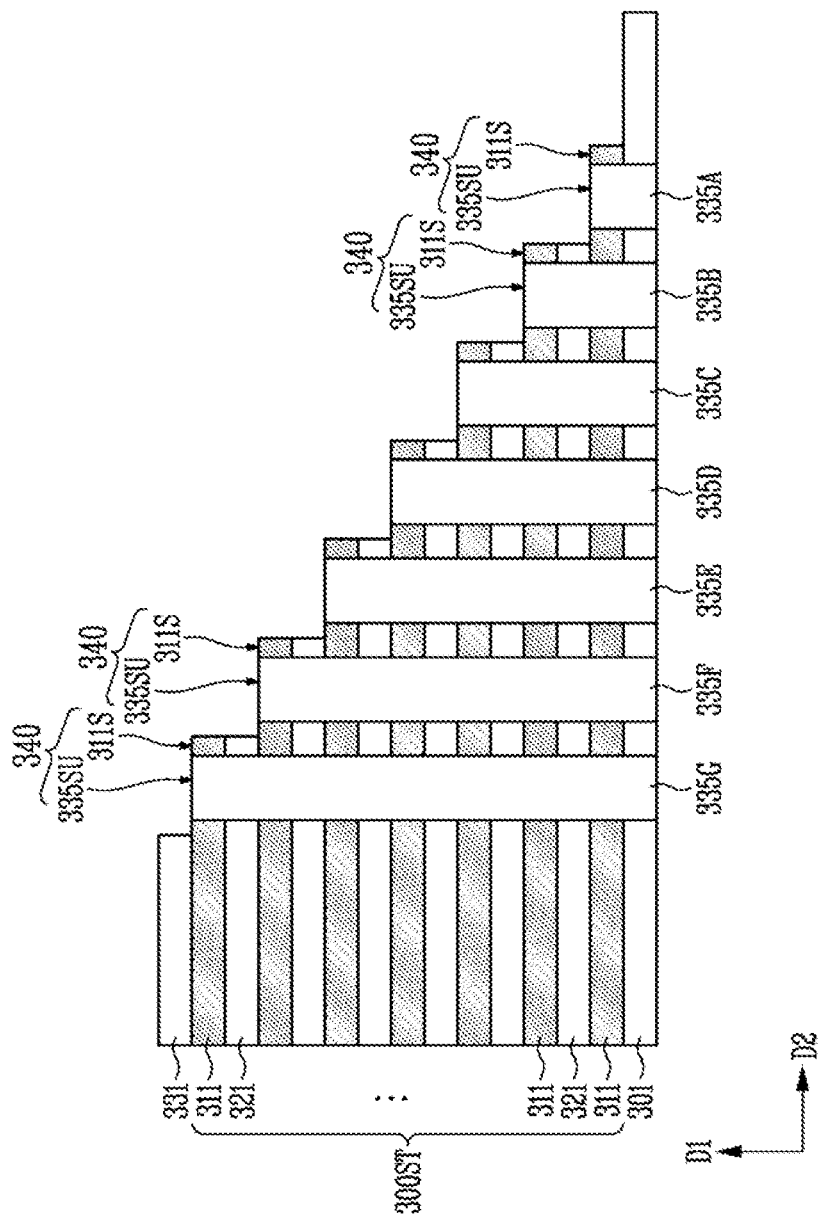

FIGS. 11A and 11B are diagrams illustrating an example of a process of forming insulating pillars and a stepped structure.

Referring to FIGS. 11A and 11B, a stepped structure 300ST may be defined by etching the second insulating layer 331 and the stacked body 300 illustrated in FIGS. 10A and 10B. In this case, the insulating pillars 335A to 335G may be defined by etching the preliminary insulating pillars 335 illustrated in FIGS. 10A and 10B.

The insulating pillars 335A to 335G may have different lengths in the first direction D1. Each of upper surfaces 335SU of the insulating pillars 335A to 335G may be disposed at a level lower than a level at which the second insulating layer 331 is disposed. The upper surfaces 335SU of the insulating pillars 335A to 335G might not be covered with the second insulating layer 331 but may be exposed.

The stepped structure 300ST may include steps formed of upper surfaces 311S of the first material layers 311. The upper surfaces 311S of the first material layers 311 might not be covered with the second insulating layer 331 but may be exposed.

The upper surfaces 311S of the first material layers 311 and the upper surfaces 335SU of the insulating pillars 335A to 335G may provide pad regions 340.

FIGS. 12A, 12B, 13A, 13B, 14A, 14B, 15A, and 15B are diagrams illustrating an example of a process of forming pad patterns.

Figure 12A:
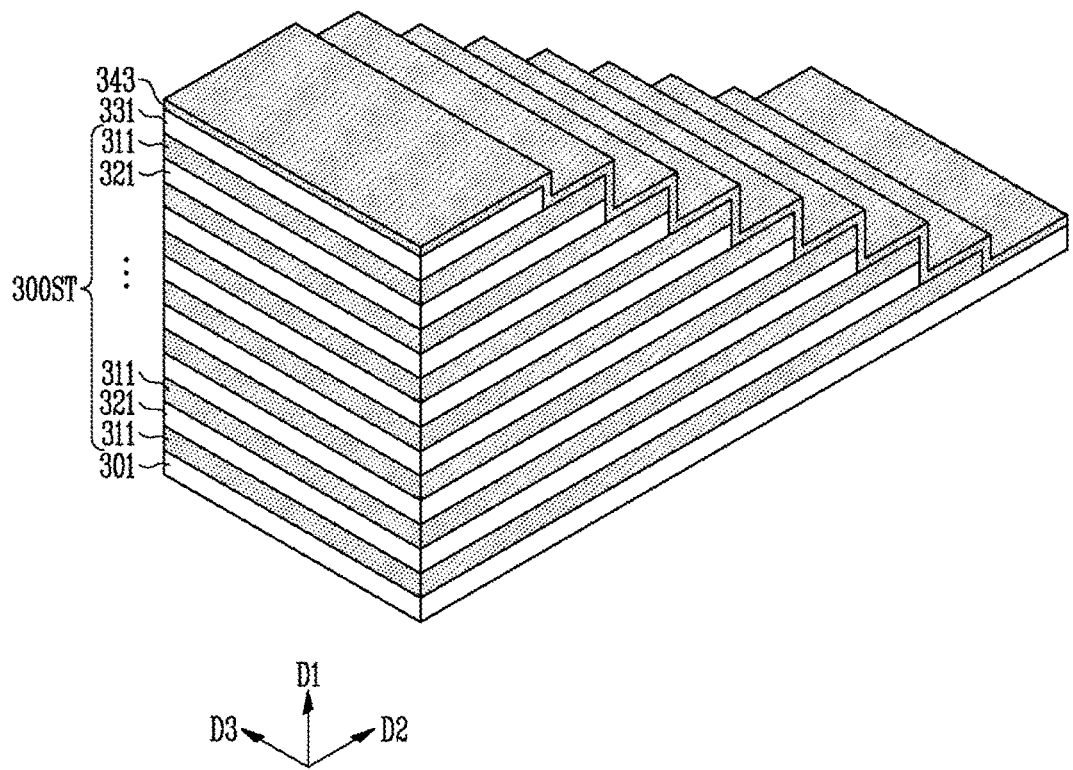
Figure 12B:
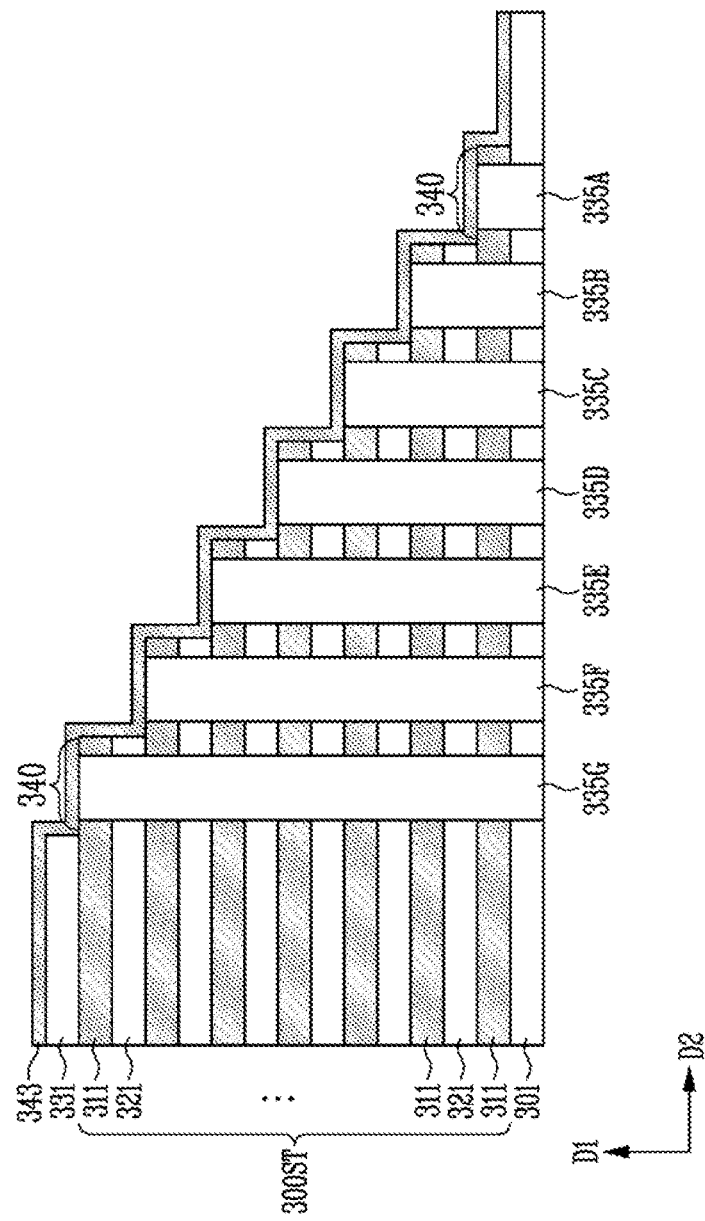

Referring to FIGS. 12A and 12B, a pad layer 343 may be conformally formed on the stepped structure 300ST to follow the contour of the stepped structure 300ST. The pad layer 343 may extend to cover the first insulating layer 301 and the second insulating layer 331. The pad layer 343 may cover the insulating pillars 335A to 335G. In the structure of the above-described pad layer 343, the pad regions 340 may be covered with the pad layer 343.

The pad layer 343 may be formed of a material different from that of the first insulating layer 301, the second material layers 321, and the second insulating layer 331. In an embodiment, the pad layer 343 may include a conductive material. In an embodiment, the pad layer 343 may include an insulating material having an etch selectivity relative to the first insulating layer 301, the second material layers 321, and the second insulating layer 331. For example, the pad layer 343 may include silicon nitride.

Figure 13A:
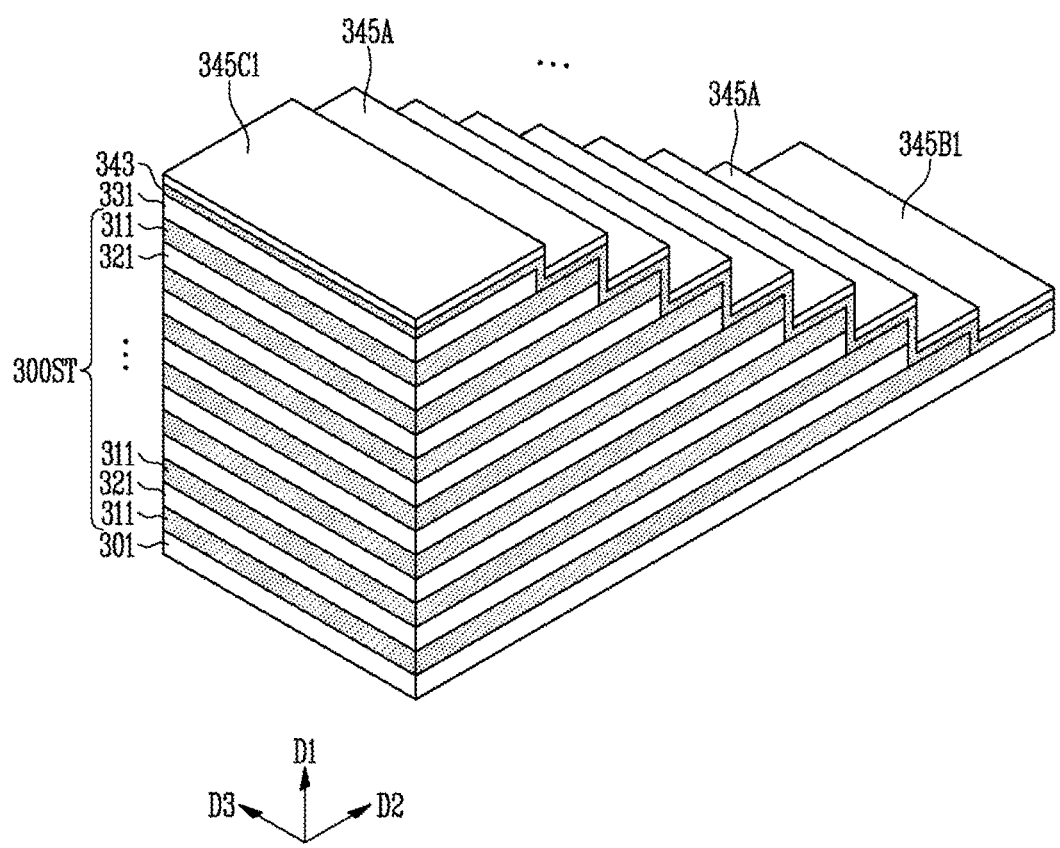

Referring to FIGS. 13A and 13B, the insulating patterns 345A, 345B1, and 345C1 may be formed on the pad layer 343. The insulating patterns 345A, 345B1, and 345C1 may include a material having an etch selectivity relative to the pad layer 343. In an embodiment, the insulating patterns 345A, 345B1, and 345C1 may include an oxide.

The insulating patterns 345A, 345B1, and 345C1 may include a plurality of first insulating patterns 345A, a second insulating pattern 345B1, and a third insulating pattern 345C1. The first insulating patterns 345A, the second insulating pattern 345B1, and the third insulating pattern 345C1 may be spaced apart from each other.

The first insulating patterns 345A may overlap the pad regions 340, respectively. In other words, the first insulating patterns 345A may overlap the upper surfaces 311S of the first material layers 311 as well as the upper surfaces 335SU of the insulating pillars 335A to 335G, respectively.

The second insulating pattern 345B1 may overlap the first insulating layer 301. The second insulating pattern 345B1 may be disposed closer to the first insulating layer 301 than each of the first insulating patterns 345A in the first direction D1. A portion of the pad layer 343 may be interposed between the first insulating layer 301 and the second insulating pattern 345B1, which are adjacent to each other in the first direction D1. The first insulating layer 301 may extend longer than the first material layers 311 and the second material layers 321 in the second direction D2. The second insulating pattern 345B1 may overlap the first insulating layer 301 without interposing the first material layers 311 and the second material layers 321.

The third insulating pattern 345C1 may overlap the second insulating layer 331. The third insulating pattern 345C1 may be disposed farther away from the first insulating layer 301 than each of the first insulating patterns 345A in the first direction D1. A portion of the pad layer 343 may be interposed between the second insulating layer 331 and the third insulating pattern 345C1, which are adjacent to each other in the first direction D1. The first material layers 311 and the second material layers 321 may be interposed between the first insulating layer 301 and the third insulating pattern 345C1, which are adjacent to each other in the first direction D1.

Figure 14A:
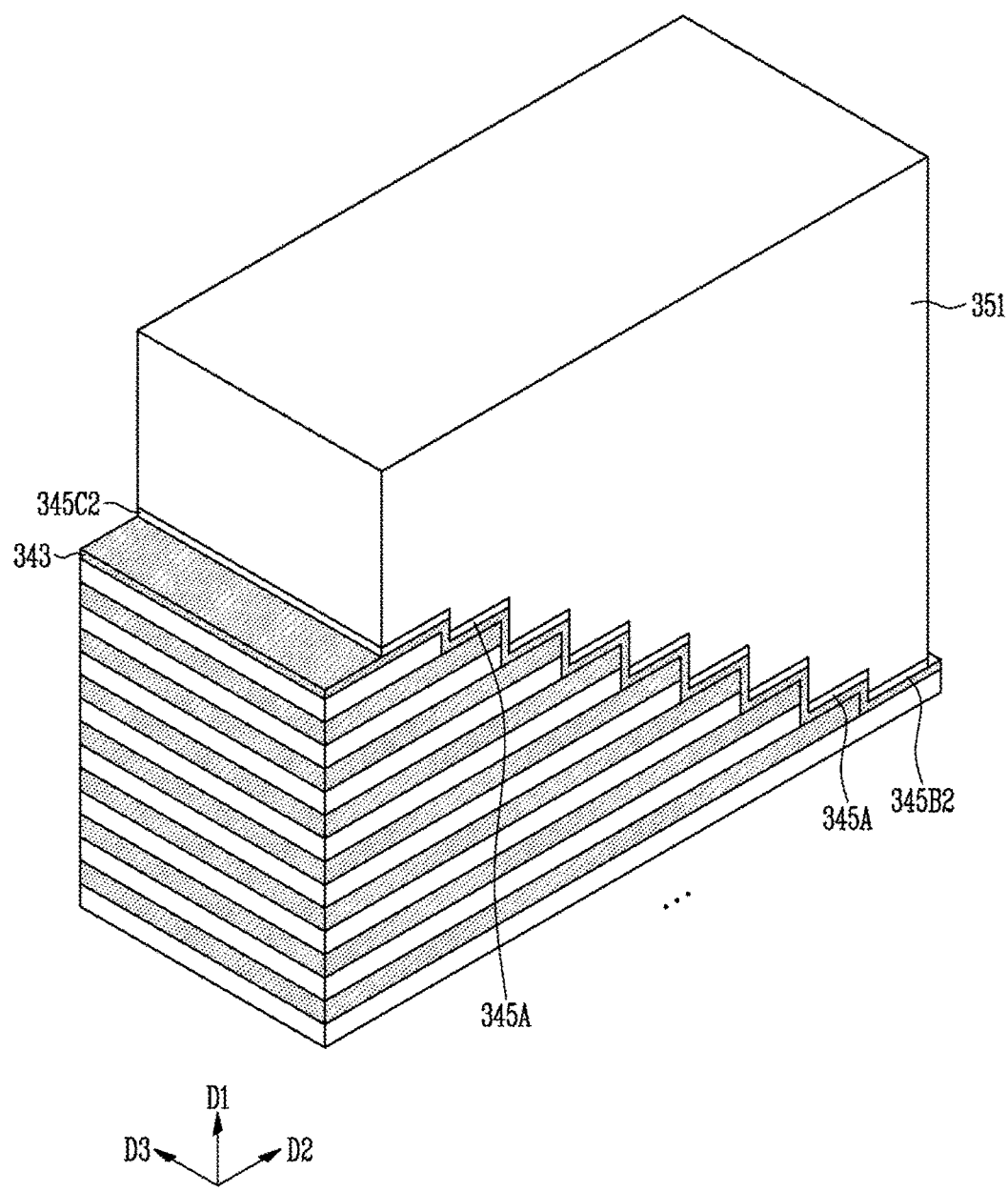

Referring to FIGS. 14A and 14B, a mask pattern 351 may be formed to cover the first insulating patterns 345A. In an embodiment, the mask pattern 351 may be a photoresist pattern defined by a photolithography process. The mask pattern 351 may include an end overlapping with a portion of the second insulating pattern 345B1 illustrated in FIGS. 13A and 13B, and an end overlapping with a portion of the third insulating pattern 345C1 illustrated in FIGS. 13A and 13B.

Subsequently, some region of each of the second insulating pattern 345B1 and the third insulating pattern 345C1 illustrated in FIGS. 13A and 13B may be removed by an etching process using the mask pattern 351 as an etching barrier. Thus, the second insulating pattern 345B2 and the third insulating pattern 345C2, whose widths are narrowed, may remain, and a portion of the pad layer 343 may be exposed.

Thereafter, the mask pattern 351 may be removed.

Figure 15A:
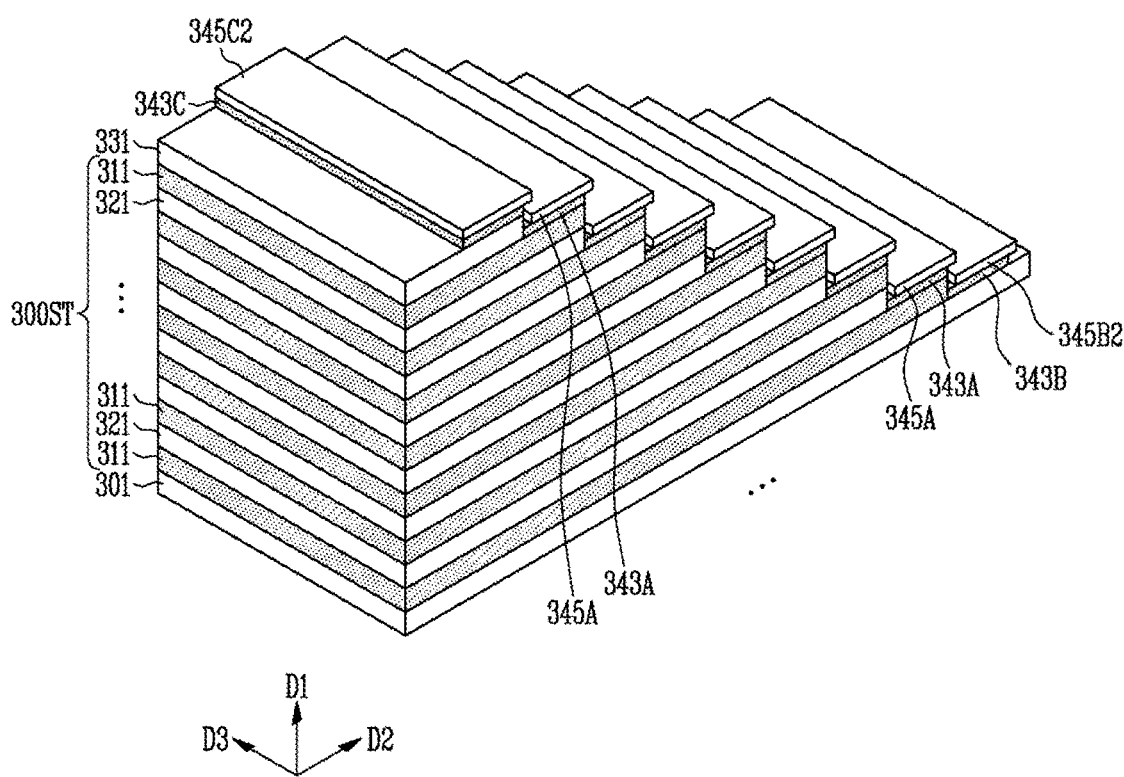
Figure 15B:
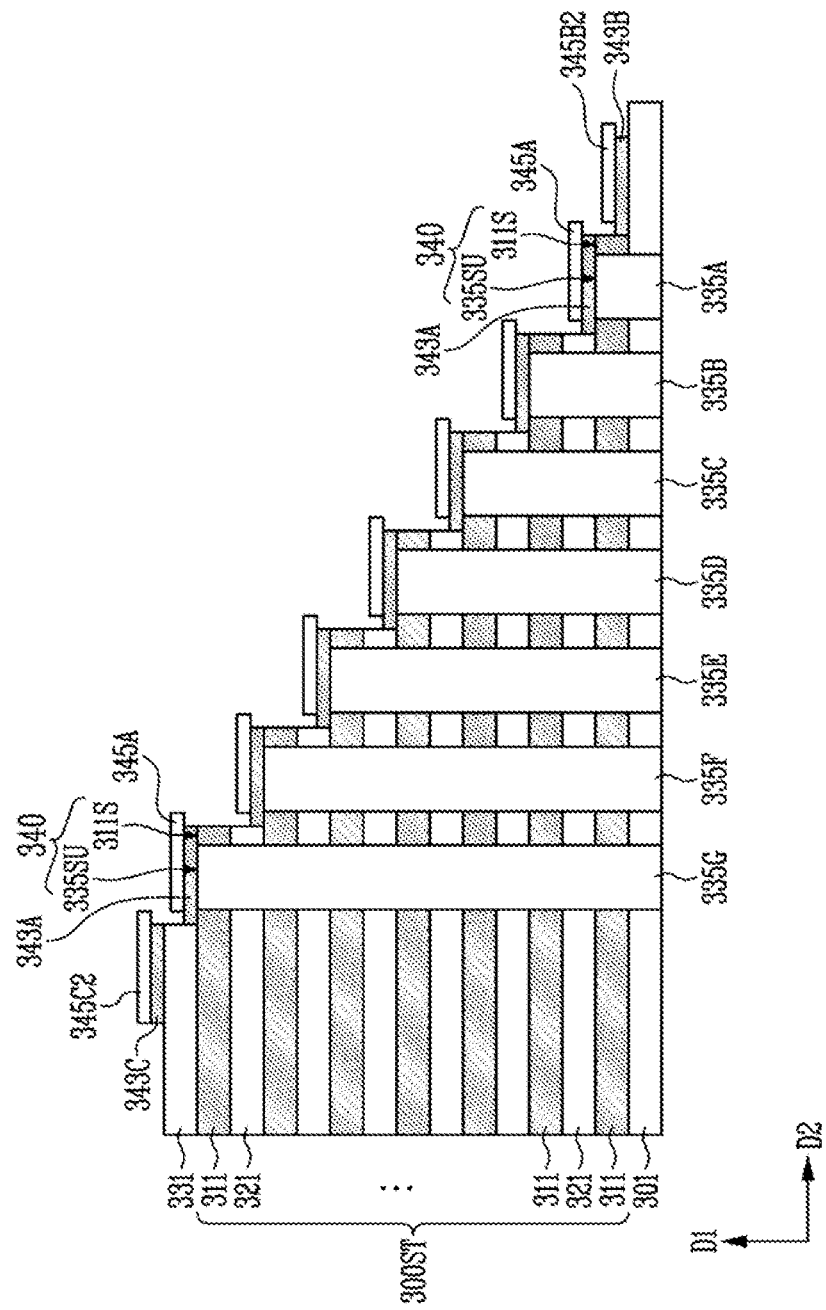

Referring to FIGS. 15A and 15B, a portion of the pad layer 343 illustrated in FIGS. 14A and 14B may be removed through an etching process using the first insulating patterns 345A, the second insulating pattern 345B2, and the third insulating pattern 345C2 as the etching barrier. Here, the etching process may be performed to expose the sidewalls of the second material layers 321. By the etching process, the pad layer 343 illustrated in FIGS. 14A and 14B may be separated into pad patterns 343A, 343B, and 343C.

The pad patterns 343A, 343B, and 343C may include a plurality of first pad patterns 343A, a second pad pattern 343B, and a third pad pattern 343C. The first pad patterns 343A, the second pad pattern 343B, and the third pad pattern 343C may be spaced apart from each other. The first pad patterns 343A, the second pad pattern 343B, and the third pad pattern 343C may be disposed at different levels.

The first pad patterns 343A may be disposed on the pad regions 340. In other words, the first pad patterns 343A may overlap the upper surfaces 311S of the first material layers 311 as well as the upper surfaces 335SU of the insulating pillars 335A to 335G, respectively.

The second pad pattern 343B may be disposed between the second insulating pattern 345B2 and the first insulating layer 301. The third pad pattern 343C may be disposed between the third insulating pattern 345C2 and the second insulating layer 331.

Figure 16A:
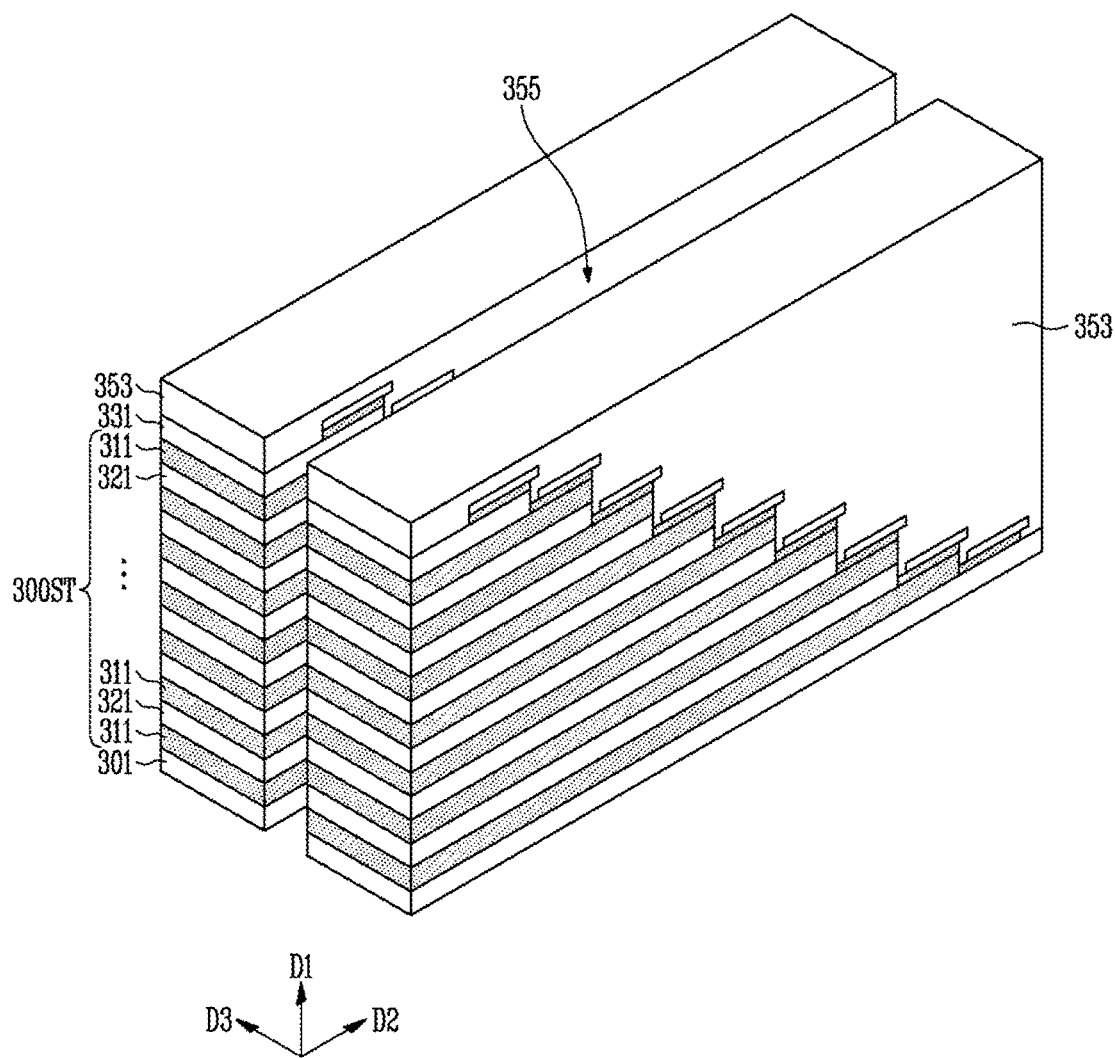
FIGS. 16A and 16B are diagrams illustrating an example of a process of forming a slit in accordance with the present disclosure.
Figure 16B:
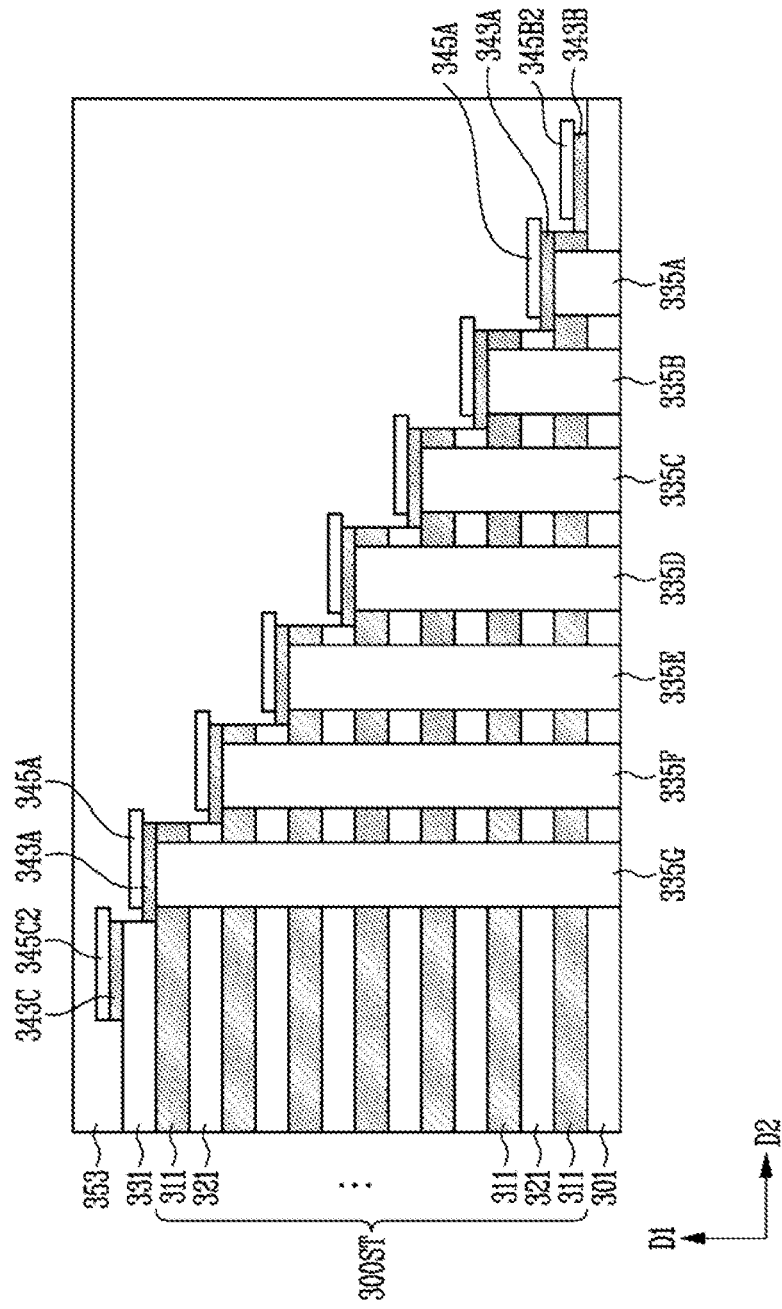

FIGS. 16A and 16B are diagrams illustrating an example of a process of forming a slit.

Referring to FIGS. 16A and 16B, an upper insulating layer 353 may be formed on the second insulating layer 331. The upper insulating layer 353 may cover the first insulating patterns 345A, the second insulating pattern 345B2, and the third insulating pattern 345C2. The upper insulating layer 353 may cover the first pad patterns 343A, the second pad pattern 343B, and the third pad pattern 343C. The upper insulating layer 353 may cover the stepped structure 300ST and the first insulating layer 301. The upper insulating layer 353 may fill spaces between the first insulating patterns 345A, the second insulating pattern 345B2, and the second material layers 321.

The upper insulating layer 353 may be formed of material different from that of the first material layers 311, the first pad patterns 343A, the second pad pattern 343B, and the third pad pattern 343C. In an embodiment, the upper insulating layer 353 may include an insulating material having an etch selectivity relative to the first material layers 311, the first pad patterns 343A, the second pad pattern 343B, and the third pad pattern 343C. For example, the upper insulating layer 353 may include an oxide.

Subsequently, a slit 355 may be formed through the etching process. The slit 355 may pass through the upper insulating layer 353, the second insulating layer 331, the first material layers 311, the second material layers 321, and the first insulating layer 301. The slit 355 may extend to pass through the first insulating patterns 345A, the second insulating pattern 345B2, and the third insulating pattern 345C2. The slit 355 may extend to pass through the first pad patterns 343A, the second pad pattern 343B, and the third pad pattern 343C.

Each of the first insulating layer 301, the first material layers 311, the second material layers 321, the upper insulating layer 353, the second insulating layer 331, the first pad patterns 343A, the second pad pattern 343B, the third pad pattern 343C, the first insulating patterns 345A, the second insulating pattern 345B2, and the third insulating pattern 345C2 may remain on both sides of the slit 355.

Subsequent processes may vary.

Figure 19:
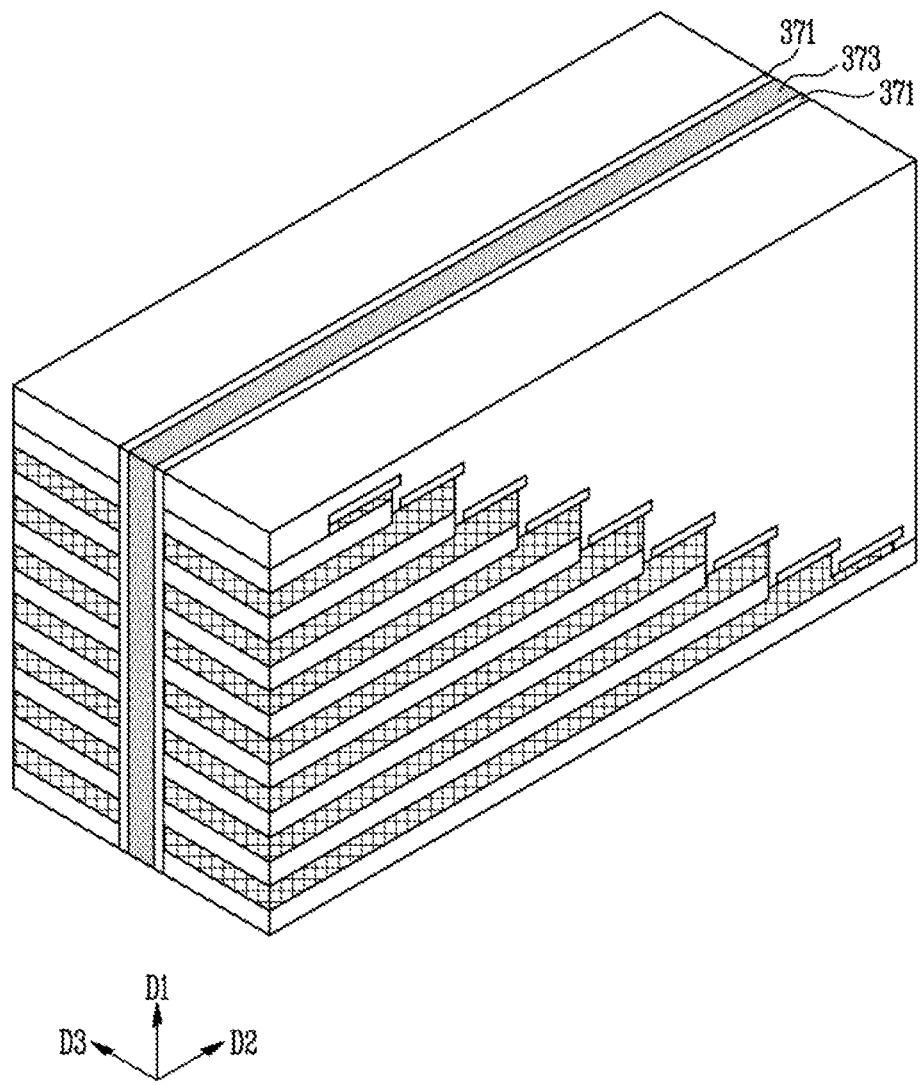
FIG. 19 is a perspective view illustrating an example of a process of forming a sidewall insulating layer and a conductive source contact in accordance with the present disclosure.
Figure 20:
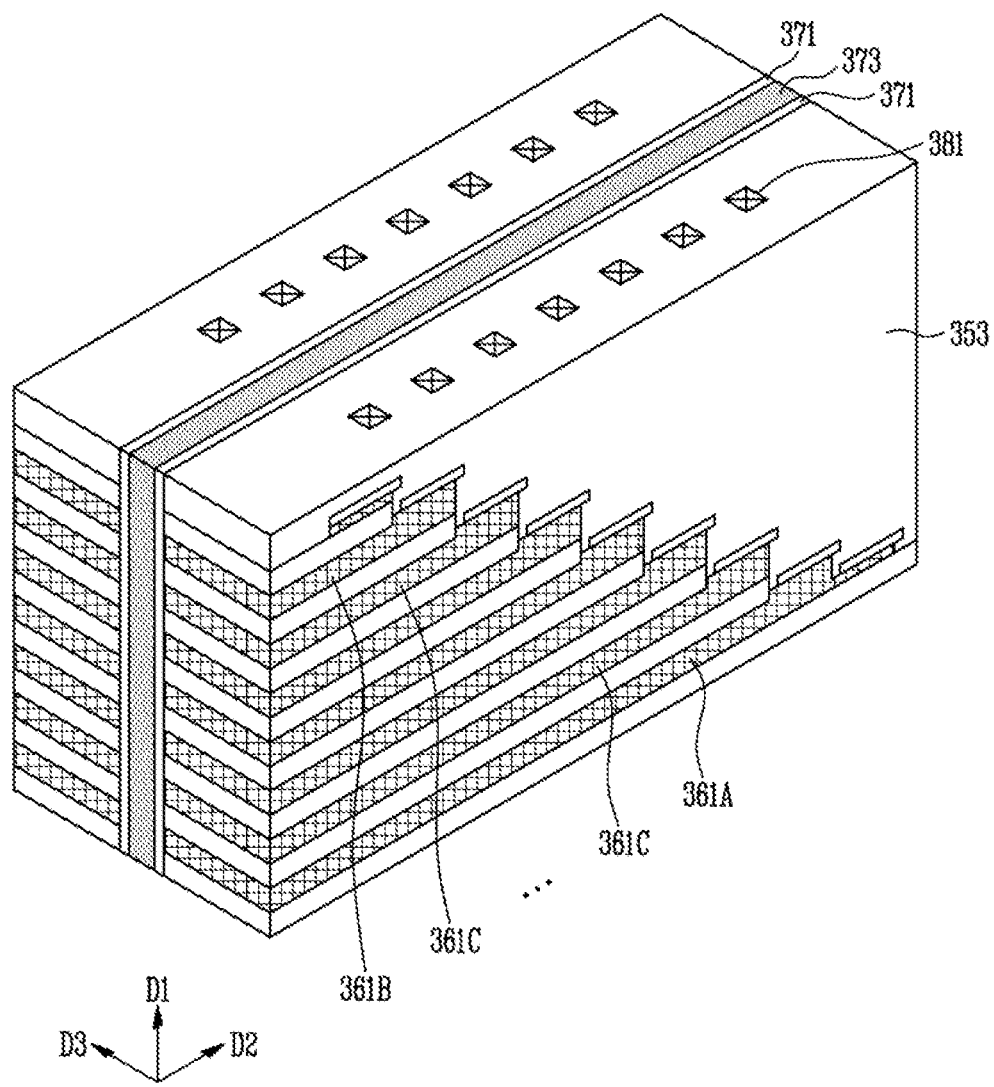
FIG. 20 is a perspective view illustrating an example of a process of forming conductive contacts in accordance with the present disclosure.

In an embodiment, when each of the first material layers 311, the first pad patterns 343A, the second pad pattern 343B, and the third pad pattern 343C includes a conductive material, processes shown in FIGS. 19 and 20 may follow. The first material layers 311, the first pad patterns 343A, and the second pad pattern 343B, which are formed of a conductive material, may be used as the conductive patterns 111 illustrated in FIGS. 5 and 8. The third pad pattern 343C formed of the conductive material may be used as the dummy conductive pattern 141 illustrated in FIGS. 5 and 8.

In an embodiment, when each of the first material layers 311, the first pad patterns 343A, the second pad pattern 343B, and the third pad pattern 343C includes an insulating material, a process of replacing the first material layers 311, the first pad patterns 343A, the second pad pattern 343B, and the third pad pattern 343C with the conductive patterns is performed, and then processes illustrated in FIGS. 19 and 20 may be performed.

FIGS. 17A, 17B, 18A, and 18B are diagrams illustrating an example of a process of forming conductive patterns.

Figure 17A:
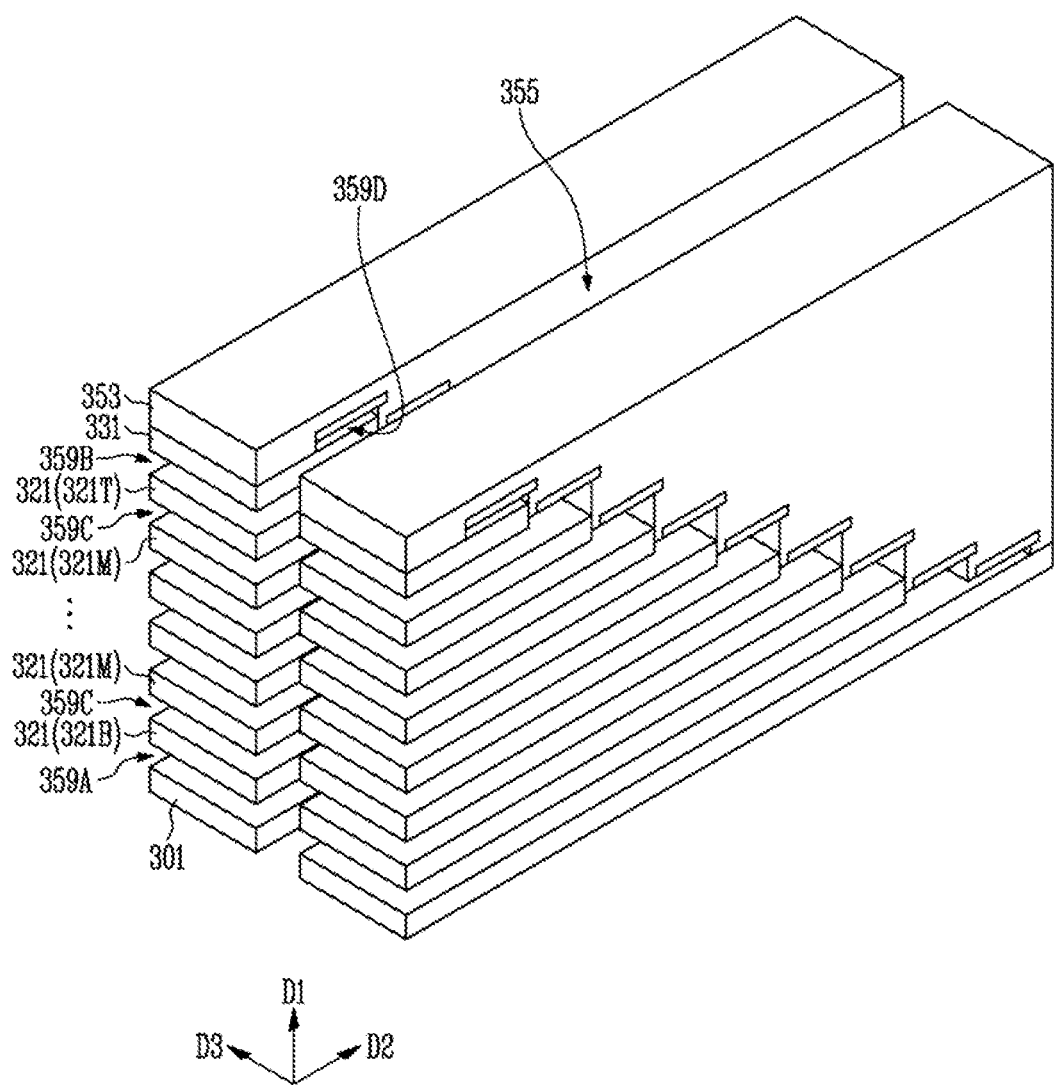

Referring to FIGS. 17A and 17B, the first material layers 311, the first pad patterns 343A, the second pad pattern 343B, and the third pad pattern 343C may be selectively removed through the slit 355. Thus, openings 359A, 359B, 359C, and 359D may be defined.

The openings 359A, 359B, 359C, and 359D may be spaced apart from each other in the first direction D1 by the second material layers 321 and the second insulating layer 331. The openings 359A, 359B, 359C, and 359D may include a first opening 359A, a second opening 359B, a plurality of third openings 359C, and a fourth opening 359D.

Hereinafter, the insulating pillars 335A to 335G are separately referred to as the first insulating pillar 335A, the second insulating pillar 335G, and the third insulating pillars 335B to 335F. The first insulating pillar 335A may have the shortest length among the insulating pillars 335A to 335G, while the second insulating pillar 335G may have the longest length among the insulating pillars 335A to 335G. The third insulating pillars 335B to 335F may be defined as insulating pillars other than the first insulating pillar 335A and the second insulating pillar 335G among the insulating pillars 335A to 335G.

Hereinafter, the second material layers 321 are separately referred to as a lowermost second material layer 321B, middle second material layers 321M, and an uppermost second material layer 321T. Among the second material layers 321, the lowermost second material layer 321B may be disposed closest to the first insulating layer 301 in the first direction D1. Among the second material layers 321, the uppermost second material layer 321T may be disposed farthest away from the first insulating layer 301 in the first direction D1. The middle second material layers 321M may be disposed between the lowermost second material layer 321B and the uppermost second material layer 321T to be spaced apart therefrom in the first direction D1.

The first opening 359A may extend from between the first insulating layer 301 and the lowermost second material layer 321B to between the first insulating layer 301 and the first insulating pattern 345A overlapping the first insulating pillar 335A. Furthermore, the first opening 359A may extend between the first insulating layer 301 and the second insulating pattern 345B2. The end 335EG of the first insulating pillar 335A may be exposed by the first opening 359A.

The second opening 359B may extend from between the uppermost second material layer 321T and the second insulating layer 331 to between the uppermost second material layer 321T and the first insulating pattern 345A overlapping the second insulating pillar 335G. The end 335EG of the second insulating pillar 335G may be exposed by the second opening 359B.

The third openings 359C may be defined between the second material layers 321 that are adjacent to each other in the first direction D1. The third openings 359C may extend between the first insulating patterns 345A overlapping the third insulating pillars 335B to 335F and the middle second material layers 321M. The ends 335EG of the third insulating pillars 335B to 335F may be exposed by the third openings 359C, respectively.

The fourth opening 359D may be defined between the second insulating layer 331 and the third insulating pattern 345C2.

Figure 18A:
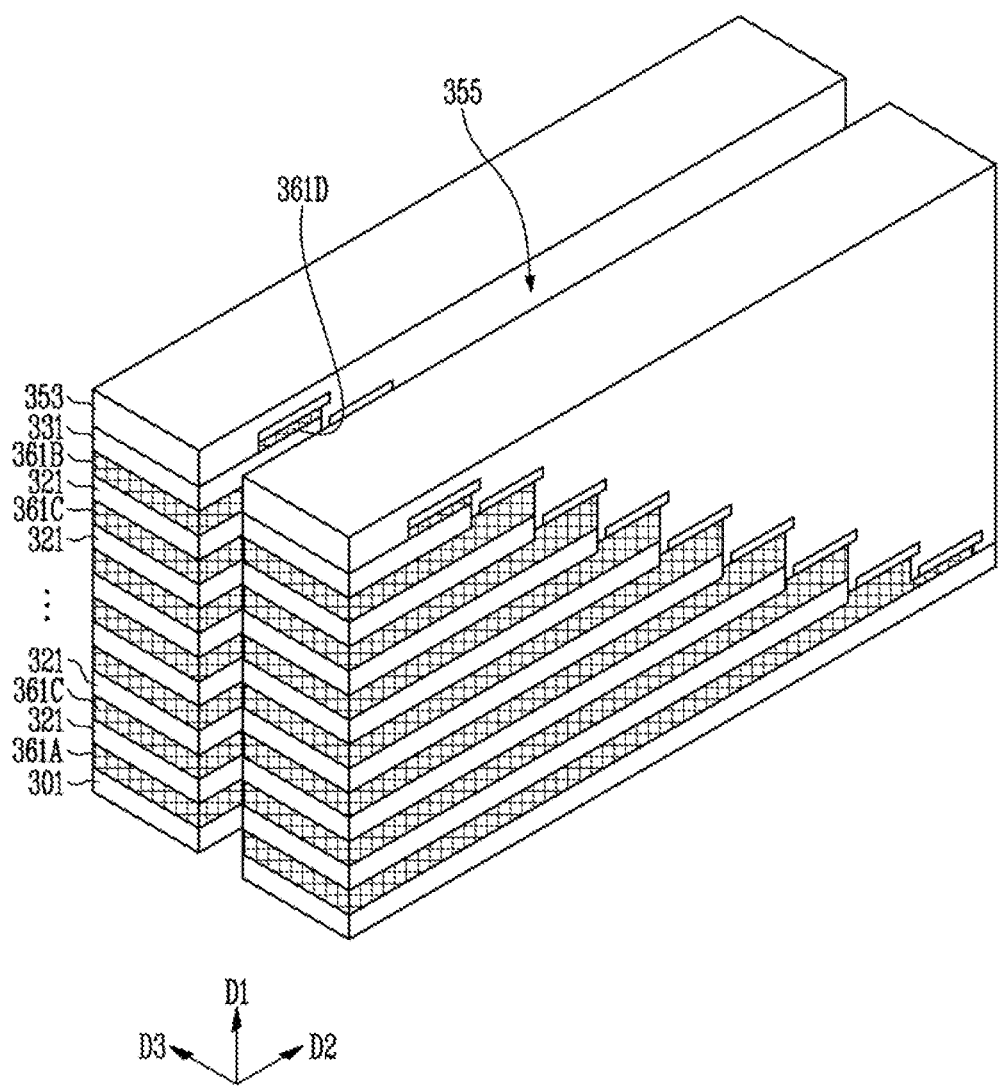
Figure 18B:
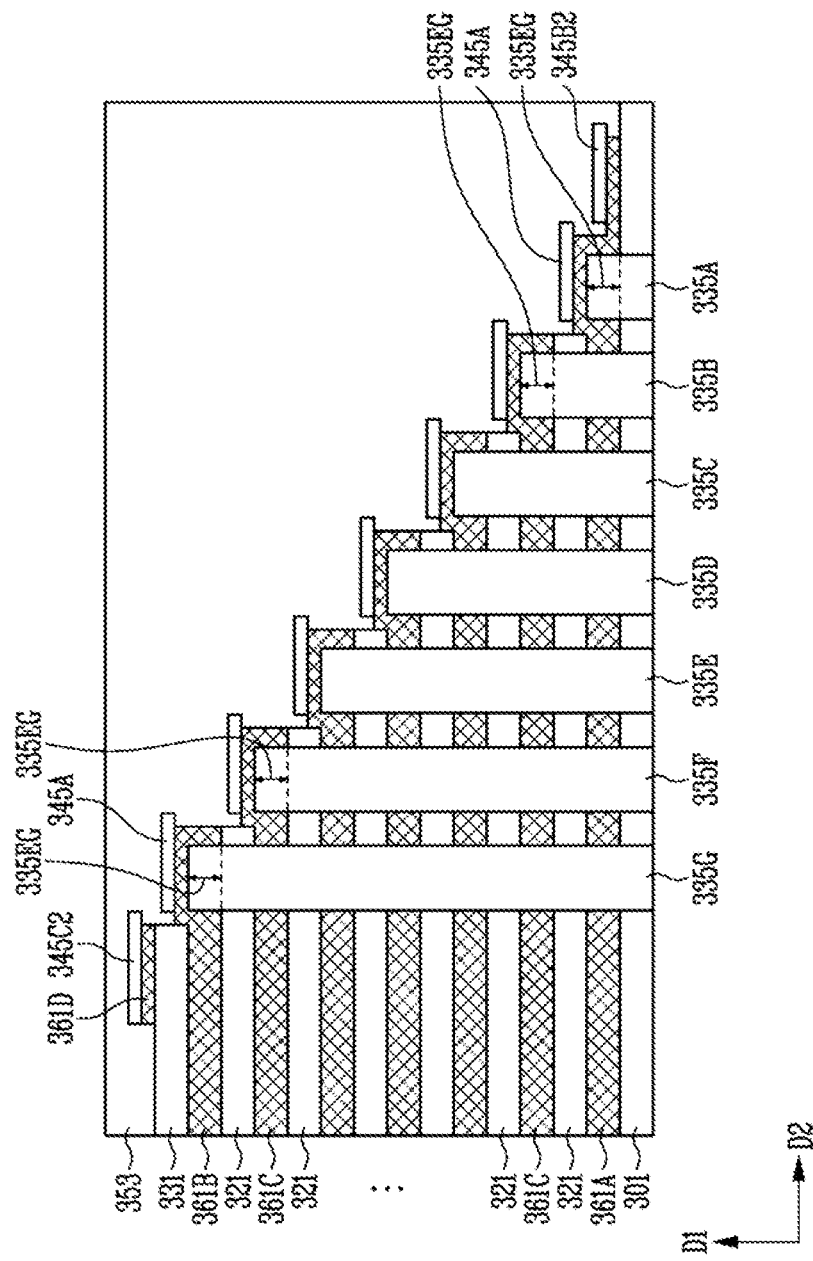

Referring to FIGS. 18A and 18B, the first opening 359A, the second opening 359B, the third openings 359C, and the fourth opening 359D shown in FIGS. 17A and 17B may be filled with the conductive patterns 361A, 361B, 361C, and 361D. The conductive patterns 361A, 361B, 361C, and 361D may be formed by introducing conductive material through the slit 355.

The conductive patterns 361A, 361B, 361C, and 361D may be insulated from each other by the second material layers 321 and the second insulating layer 331. The conductive patterns 361A, 361B, 361C, and 361D may enclose the ends 335EG of the insulating pillars 335A to 335G at different levels, respectively. The conductive patterns 361A, 361B, 361C, and 361D may include a lower conductive pattern 361A, an upper conductive pattern 361B, a plurality of intermediate conductive patterns 361C, and a dummy conductive pattern 361D.

The lower conductive pattern 361A may fill the first opening 359A shown in FIGS. 17A and 17B. The lower conductive pattern 361A may enclose the end 335EG of the first insulating pillar 335A. The lower conductive pattern 361A may extend between the first insulating pillar 335A and the first insulating pattern 345A overlapping the first insulating pillar 335A.

The upper conductive pattern 361B may fill the second opening 359B shown in FIGS. 17A and 17B. The upper conductive pattern 361B may enclose the end 335EG of the second insulating pillar 335G. The upper conductive pattern 361B may extend between the second insulating pillar 335G and the first insulating pattern 345A overlapping the second insulating pillar 335G.

The intermediate conductive patterns 361C may fill the third openings 359C illustrated in FIGS. 17A and 17B, respectively. The intermediate conductive patterns 361C may enclose the ends 335EG of the third insulating pillars 335B to 335F, respectively. The intermediate conductive patterns 361C may extend between the third insulating pillars 335B to 335F and the first insulating patterns 345A overlapping the third insulating pillars 335B to 335F.

Although not shown in the drawing, the mask pattern 351 illustrated in FIGS. 14A and 14B might not overlap the third insulating pattern 345C1 and the second insulating pattern 345B1 illustrated in FIGS. 13A and 13B. In this case, the second insulating pattern 345B2, the third insulating pattern 345C2, and the dummy conductive pattern 361D might not remain, and the end of the lower conductive pattern 361A may have a structure similar to that of the end of each of the intermediate conductive patterns 361C.

FIG. 19 is a perspective view illustrating an example of a process of forming a sidewall insulating layer and a conductive source contact.

Referring to FIG. 19, in an embodiment, a sidewall insulating layer 371 may be formed on the sidewall of the slit 355 illustrated in FIG. 18A. Thereafter, a conductive source contact 373 extending along the sidewall insulating layer 371 may be formed.

In an embodiment, when each of the pad patterns 343A illustrated in FIG. 16B remains as a portion of the conductive pattern, the sidewall insulating layer 371 and the conductive source contact 373 may be formed in the slit 355 illustrated in FIG. 16A.

FIG. 20 is a perspective view illustrating an example of a process of forming conductive contacts.

Referring to FIG. 20, conductive contacts 381 may be formed to pass through the upper insulating layer 353. The conductive contacts 381 may pass through the first insulating patterns 345A. In an embodiment, the conductive contacts 381 may overlap the insulating pillars 335A to 335G illustrated in FIG. 18B, and may be coupled to the conductive patterns 361A, 361B, and 361C.

Although not shown in the drawing, in an embodiment, when each of the pad patterns 343A illustrated in FIG. 16B remains as a portion of the conductive pattern, the conductive contacts 381 may be coupled to the pad patterns 343A illustrated in FIG. 16B.

A connection structure of the conductive contacts 381 and the conductive patterns 361A, 361B, and 361C may be the same as a connection structure of the conductive contacts 185 and the conductive patterns 111 illustrated in FIG. 6A, or may be the same as a connection structure of the conductive contacts 185' and the conductive patterns 111 illustrated in FIG. 8.

Similar to that described with reference to FIG. 7, the cross-sectional area of the conductive contacts 381 may be smaller than the cross-sectional area of the insulating pillars 335A to 335G shown in FIG. 18B.

Figure 21:
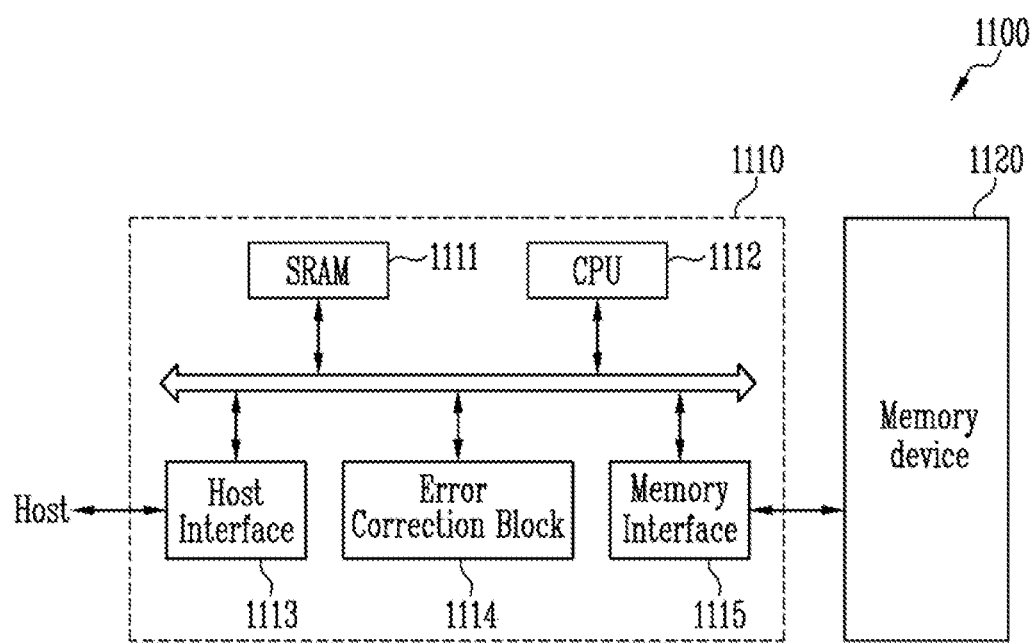
FIG. 21 is a block diagram illustrating a configuration of a memory system in accordance with an embodiment of the present disclosure.

FIG. 21 is a block diagram illustrating the configuration of a memory system 1100 in accordance with an embodiment of the present disclosure.

Referring to FIG. 21, the memory system 1100 includes a memory device 1120 and a memory controller 1110.

The memory device 1120 may be a multi-chip package formed of a plurality of flash memory chips. The memory device 1120 may include a first conductive pattern, a second conductive pattern that overlaps a line component of the first conductive pattern and exposes a pad component of the first conductive pattern, an interlayer insulating layer provided between the first conductive pattern and the second conductive pattern, and a first conductive contact and a first insulating pillar extending in opposite directions from the pad component of the first conductive pattern.

The memory controller 1110 may control the memory device 1120, and include static random access memory (SRAM) 1111, a central processing unit (CPU) 1112, a host interface 1113, an error correction block 1114, and a memory interface 1115. The SRAM 1111 may be used as operating memory of the CPU 1112. The CPU 1112 may perform overall control operations for data exchange of the memory controller 1110. The host interface 1113 may be provided with a data interchange protocol of a host coupled with the memory system 1100. The error correction block 1114 detects an error included in data read from the memory device 1120, and corrects the detected error. The memory interface 1115 may interface with the memory device 1120. The memory controller 1110 may further include read only memory (ROM) or the like that stores code data for interfacing with a host.

The above-described memory system 1100 may be a memory card or a solid state drive (SSD) equipped with the memory device 1120 and the memory controller 1110. For example, when the memory system 1100 is an SSD, the memory controller 1110 may communicate with an external device (e.g., a host) via one of various interface protocols, such as a universal serial bus (USB), a multimedia card (MMC), a peripheral component interconnection-express (PCI-E), a serial advanced technology attachment (SATA), a parallel advanced technology attachment (PATA), a small computer system interface (SCSI), an enhanced small disk interface (ESDI), and an integrated drive electronics (IDE) protocols.

Figure 22:
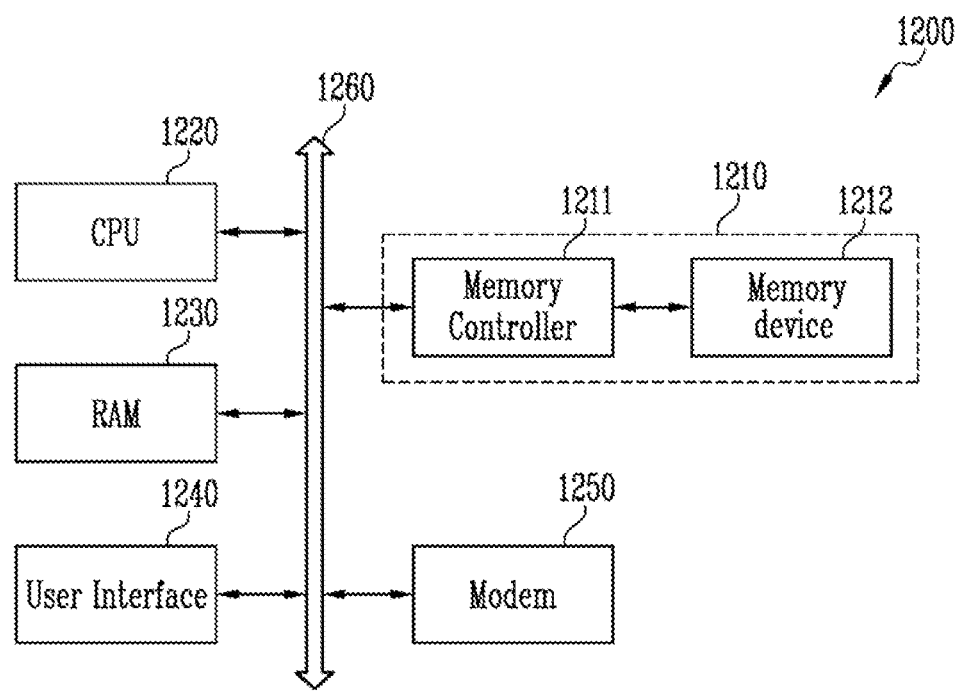
FIG. 22 is a block diagram illustrating a configuration of a computing system in accordance with an embodiment of the present disclosure.

FIG. 22 is a block diagram illustrating the configuration of a computing system 1200 in accordance with an embodiment of the present disclosure.

Referring to FIG. 22, the computing system 1200 may include a CPU 1220, random access memory (RAM) 1230, a user interface 1240, a modem 1250, and a memory system 1210 that are electrically coupled to a system bus 1260. If the computing system 1200 is a mobile device, it may further include a battery for supplying an operating voltage to the computing system 1200. An application chip set, an image processor, a mobile DRAM and the like may be further included.

The memory system 1210 may include a memory device 1212 and a memory controller 1211.

The memory device 1212 may include a first conductive pattern, a second conductive pattern that overlaps a line component of the first conductive pattern and exposes a pad component of the first conductive pattern, an interlayer insulating layer provided between the first conductive pattern and the second conductive pattern, and a first conductive contact and a first insulating pillar extending in opposite directions from the pad component of the first conductive pattern.

According to the present disclosure, a conductive contact overlaps an insulating pillar, thus preventing a process failure in which the conductive contact is simultaneously coupled to conductive patterns arranged at different levels. According to the present disclosure, the stability of a manufacturing process of a semiconductor memory device may be improved, and the operational reliability of the semiconductor memory device may be increased.

What is claimed is:
1. A semiconductor memory device, comprising:
a first conductive pattern including a first line component and a first pad component extending from the first line component;
a second conductive pattern overlapping the first line component of the first conductive pattern and leaving the first pad component of the first conductive pattern exposed, the second conductive pattern spaced apart from the first conductive pattern in a first direction;
an interlayer insulating layer between the first conductive pattern and the second conductive pattern;
a first conductive contact extending from the first pad component of the first conductive pattern in the first direction; and
a first insulating pillar overlapped by the first conductive contact and extending from the first pad component in a direction opposite to the first direction,
wherein the first insulating pillar includes a top surface facing the first conductive contact,
wherein the first pad component and the first line component form one body, and
wherein the first pad component completely covers the top surface of the first insulating pillar.

2. The semiconductor memory device according to claim 1, wherein a cross-sectional area of the first insulating pillar is greater than a cross-sectional area of the first conductive contact.

3. The semiconductor memory device according to claim 1,
wherein a bottom of the first pad component of the first conductive pattern includes a depression, the bottom facing the direction opposite to the first direction, and
wherein the first insulating pillar includes an end inserted into the depression.

4. The semiconductor memory device according to claim 3, wherein a thickness of the first pad component in the first direction is greater than both:
a depth of the depression in the first direction; and
a thickness of the first line component in the first direction.

5. The semiconductor memory device according to claim 1, wherein the second conductive pattern comprises:
a second pad component adjacent to the first pad component of the first conductive pattern; and
a second line component extending from the second pad component.

6. The semiconductor memory device according to claim 5, further comprising:
a second conductive contact extending from the second pad component of the second conductive pattern in the first direction; and
a second insulating pillar overlapped by the second conductive contact and extending from the second pad component in the direction opposite to the first direction.

7. The semiconductor memory device according to claim 6, wherein the second insulating pillar passes through the interlayer insulating layer and the first line component of the first conductive pattern.

8. The semiconductor memory device according to claim 1, wherein the first pad component has a top surface facing the first direction, and
wherein the top surface of the first pad component is located at a level higher than a level where the first line component is located.

9. The semiconductor memory device according to claim 1, wherein the first pad component extends on a sidewall of the interlayer insulating layer.

10. A semiconductor memory device, comprising:
a first insulating layer including a cell array region and a contact region;
insulating pillars passing through the first insulating layer in the contact region and extending to different lengths in a first direction;
conductive patterns including pad components and line components, the pad components respectively enclosing ends of the insulating pillars at different levels above the first insulating layer, the line components respectively extending from the pad components to overlap the first insulating layer in the cell array region; and
conductive contacts overlapping the insulating pillars, respectively, and coming into contact with the pad components, respectively,
wherein the conductive patterns comprise a lower conductive pattern between another conductive pattern and the first insulating layer,
wherein the pad components of the conductive patterns comprise a lower pad component of the lower conductive pattern,
wherein the line components of the conductive patterns comprise a lower line component extending from the lower pad component,
wherein the lower conductive pattern has a protrusion extending from the lower pad component in a direction opposite to that of the lower line component, and
wherein the lower line component, the lower pad component, and the protrusion form one body.

11. The semiconductor memory device according to claim 10, further comprising:
interlayer insulating layers between the conductive patterns;
a channel structure passing through the line components of the conductive patterns, the interlayer insulating layers, and the first insulating layer in the cell array region; and
a memory layer enclosing a sidewall of the channel structure.

12. The semiconductor memory device according to claim 10, wherein, in the first direction, a thickness of each of the pad components is greater than a thickness of each of the line components.

13. The semiconductor memory device according to claim 10, wherein, in the first direction, a thickness of the protrusion is smaller than a thickness of the lower line component and a thickness of the lower pad component.

14. The semiconductor memory device according to claim 10, wherein the insulating pillars include a short pillar located between the protrusion and the lower line component.

15. A semiconductor memory device, comprising:
a first insulating layer including a cell array region and a contact region;
insulating pillars passing through the first insulating layer in the contact region and extending to different lengths in a first direction;
conductive patterns including pad components and line components, the pad components respectively enclosing ends of the insulating pillars at different levels above the first insulating layer, the line components respectively extending from the pad components to overlap the first insulating layer in the cell array region;
conductive contacts overlapping the insulating pillars, respectively, and coming into contact with the pad components, respectively;
a second insulating layer on an upper line component disposed farthest away from the first insulating layer, among the line components of the conductive patterns; and
a dummy conductive pattern disposed on an edge of the second insulating layer, wherein the dummy conductive pattern does not cover the cell array region.

16. The semiconductor memory device according to claim 15, wherein, in the first direction, a thickness of the dummy conductive pattern is smaller than a thickness of each of the line components of the conductive patterns.

17. The semiconductor memory device according to claim 15, wherein a cross-sectional area of each of the insulating pillars is greater than a cross-sectional area of each of the conductive contacts.

18. The semiconductor memory device according to claim 15, wherein the pad components of the conductive patterns extend between top surfaces of the insulating pillars and bottom surfaces of the conductive contacts.

19. The semiconductor memory device according to claim 15, wherein the conductive contacts extend into the insulating pillars.

20. The semiconductor memory device according to claim 19, wherein the pad components of the conductive patterns come into contact with sidewalls of the conductive contacts.

21. The semiconductor memory device according to claim 19, wherein the conductive contacts include bottom surfaces coming into contact with the insulating pillars.

* * * * *